United States Patent
Miyata et al.

(10) Patent No.: US 8,372,480 B2
(45) Date of Patent: Feb. 12, 2013

(54) COATER/DEVELOPER, METHOD OF COATING AND DEVELOPING RESIST FILM, AND COMPUTER READABLE STORING MEDIUM

(75) Inventors: Akira Miyata, Koshi (JP); Masanori Tateyama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/178,299

(22) Filed: Jul. 7, 2011

(65) Prior Publication Data
US 2011/0262623 A1    Oct. 27, 2011

Related U.S. Application Data

(62) Division of application No. 12/248,534, filed on Oct. 9, 2008, now Pat. No. 8,015,940.

(30) Foreign Application Priority Data

Oct. 12, 2007 (JP) .................................. 2007-266498

(51) Int. Cl.
*B05D 3/02* (2006.01)
*B05D 3/06* (2006.01)

(52) U.S. Cl. ........ 427/240; 118/696; 118/698; 118/708; 118/52; 438/780; 438/782; 700/121

(58) Field of Classification Search .................. 427/240; 118/52, 696, 698, 708; 438/780, 782; 700/121
See application file for complete search history.

(56) References Cited

U.S. PATENT DOCUMENTS

| | | | |
|---|---|---|---|
| 6,507,770 B2 | 1/2003 | Tateyama et al. | |
| 7,008,124 B2 | 3/2006 | Miyata | |
| 7,357,842 B2 * | 4/2008 | Ishikawa et al. | 118/503 |
| 2005/0217581 A1* | 10/2005 | Higashi et al. | 118/719 |
| 2008/0051929 A1* | 2/2008 | Hongkham et al. | 700/214 |

FOREIGN PATENT DOCUMENTS

| | | |
|---|---|---|
| JP | 2004-193401 | 7/2004 |
| JP | 2004-193597 | 7/2004 |
| JP | 2004-200485 | 7/2004 |
| JP | 2006-222264 | 8/2006 |

* cited by examiner

*Primary Examiner* — Kirsten Jolley
(74) *Attorney, Agent, or Firm* — Oblon, Spivak, McClelland, Maier & Neustadt, L.L.P.

(57) ABSTRACT

A transfer flow is produced in accordance with a process recipe of a process to be carried out. In the transfer flow, a type of modules listed in accordance with a substrate transfer order is associated with a necessary staying time from when the substrate is transferred into a module by a substrate transfer unit to when the substrate is ready to be transferred back to the substrate transfer unit after the corresponding process is finished. A cycle limiting time is determined to be the longest necessary transfer cycle time among those obtained by dividing the necessary staying time by the number of the modules mounted in the coater/developer. The number of the modules to be used is determined to be a value obtained by dividing the necessary staying time by the cycle limiting time or a nearest integer to which the value is raised.

3 Claims, 14 Drawing Sheets

FIG.9

| STEP | MODULE | NECESSARY STAYING TIME | THE NUMBER OF MOUNTED MODULES | TRANSFER TIME |
|---|---|---|---|---|
| 1 | Start | | | |
| 2 | TRS | | | MAIN ARM A2 16 SEC |
| 3 | ADH | 60 | 4 | |
| 4 | CPL | 40 | 2 | |
| 5 | BCT | 60 | 3 | |
| 6 | LHP | 90 | 4 | |
| 7 | SBU | | | |
| 8 | CPL | 40 | 2 | MAIN ARM A3 13 SEC |
| 9 | COT | 60 | 3 | |
| 10 | LHP | 90 | 9 | |
| 11 | WEE | | 1 | |
| 12 | SBU | | | |
| 13 | ISHU | | | |
| 14 | EIF | | | |
| 15 | TRS | | | MAIN ARM A1 16 SEC |
| 16 | PHP | 120 | 6 | |
| 17 | CPL | 40 | 4 | |
| 18 | DEV | 120 | 6 | |
| 19 | LHA | 60 | 6 | |
| 20 | CPL | 20 | 2 | |
| 21 | End | | | |

FIG.12

| STEP | MODULE | NECESSARY STAYING TIME | THE NUMBER OF MOUNTED MODULES | THE NUMBER OF MODULES TO BE USED | NECESSARY TRANSFER CYCLE TIME |
|---|---|---|---|---|---|
| 1 | Start | | | | |
| 2 | TRS | | | | |
| 3 | ADH | 60 | 4 | 3 | 15 |
| 4 | CPL | 40 | 2 | 2 | 20 |
| 5 | BCT | 60 | 3 | 3 | 20 |
| 6 | LHP | 90 | 4 | 4 | 22.5 |
| 7 | SBU | | | | |
| 8 | CPL | 40 | 2 | 2 | 20 |
| 9 | COT | 60 | 3 | 3 | 20 |
| 10 | LHP | 90 | 9 | 4 | 10 |
| 11 | WEE | | 1 | | |
| 12 | SBU | | | | |
| 13 | ISHU | | | | |
| 14 | EIF | | | | |
| 15 | TRS | | | | |
| 16 | PHP | 120 | 6 | 6 | 20 |
| 17 | CPL | 40 | 4 | 2 | 10 |
| 18 | DEV | 120 | 6 | 6 | 20 |
| 19 | LHA | 60 | 6 | 3 | 10 |
| 20 | CPL | 20 | 2 | 1 | 10 |
| 21 | End | | | | |

COATER/DEVELOPER, METHOD OF COATING AND DEVELOPING RESIST FILM, AND COMPUTER READABLE STORING MEDIUM

CROSS REFERENCE TO RELATED APPLICATION

This application is a divisional Application of U.S. Ser. No. 12/248,534, filed Oct. 9, 2008, which claims priority under 35 U.S.C. 119 to Japanese Application No. 2007-266498, filed on Oct. 12, 2007. The entire contents of each Application are hereby incorporated herein by reference.

BACKGROUND OF THE INVENTION

1. Field of the Invention

The present invention relates to a coater/developer that coats a resist film on a substrate such as a semiconductor wafer, an LCD wafer (glass wafer for an Liquid Crystal Display) and develops the exposed resist film, a method of coating and developing the resist film, and a computer readable storing medium that stores a program for allowing the coater/developer to carry out the method of coating and developing the resist film.

2. Description of the Related Art

In a fabrication process of a semiconductor device or a flat panel display (FPD), photolithography is indispensable in order to form a predetermined resist pattern on a substrate. The photolithography includes a series of processes of coating resist solution in order to form a resist film on the substrate such as a semiconductor wafer (referred to as a wafer below), exposing the resist film with exposure light through a photomask, and developing the resist film. Such processes are generally carried out in a resist pattern forming apparatus having a coater/developer for forming the resist film and developing the resist film after the exposure and an exposure apparatus connected to the coater/developer.

An example of the resist pattern forming apparatus has been proposed in, for example, Patent-related Document 1. In this apparatus, wafer carriers 10 containing plural wafers W are placed on a carrier stage 11 of a carrier block 1A as shown in FIG. 1 and the wafer W in the wafer carriers 10 is delivered to a process block 1B by a transfer arm 12. After a resist solution is coated on the wafer W in order to form the resist film at a coating module 13A in the process block 1B, the wafer W with the resist film formed on the upper surface is transferred to an exposure apparatus 1D via an interface block 1C, and the wafer W undergoes an exposure process. Then, the wafer W is returned to the process block 1B and undergoes a developing process in a developing module 13B. Finally, the wafer W returns to the original wafer carrier 10.

Before and after the resist solution coating process and the developing process, wafer temperature control in a temperature control module, a wafer heating process in a heating module, and a wafer cooling process in a cooling module are carried out. The temperature control module, the heating module, and the cooling module are arranged one above another in shelf modules 14 (14a through 14c). The wafer W is transferred between places where the wafer W can be placed in the process block 1B such as the coating module 13A, the developing module 13B and the shelf modules 14A through 14C by two transfer units 15A, 15B provided in the process block 1B.

When the resist film is formed on the wafers W by various processes mentioned above, each of the wafers W to be processed is transferred by the transfer units 15A and 15B in accordance with a transfer schedule that determines the wafer W is to be transferred to a predetermined module at a predetermined timing as described in Patent-related Document 1. The transfer units 15A, 15B include two or more arms in order to hold the wafer W. The way that the wafer W is transferred by the transfer units 15A, 15B is explained as follows. The transfer unit 15A (15B) receives with an arm A1 a wafer W1, which is processed in one module M1, from the module M1, and delivers with an arm A2 a wafer W2, which is to be processed after the wafer W1, to the module M1. Then, the transfer unit 15A receives with the arm A2 a wafer W0, which is processed before the wafer W1, from a module M0, which is located downstream of the series of the process modules, and delivers with the arm A1 the wafer W1 to the module M0.

While various modules such as the coating module, the developing module and the like are mounted in the coater/developer, the number of the incorporated modules is different depending on a type of the modules. For example, the coater/developer may have three of the coating modules, three of the developing modules, and nine of the heating modules for use in heating the wafer W having the resist solution coated. In addition, the coater/developer may have three anti-reflection film forming modules. However, all the modules mounted in the coater/developer are not used in every process. Namely, the modules to be used in a particular process and the number of the modules are specified by an operator of the coater/developer when the process is carried out.

Specifically, serial numbers are given to all the modules mounted in the related art coater/developer, and the operator produces a transfer flow that determines a transfer route of the wafer W by specifying the respective serial numbers given to the corresponding modules in accordance with the order of the modules to be used. In addition, the operator selects a process recipe in each of the modules. As a result, the transfer schedule is produced. In this case, the number of the modules of the same type to be used is determined based on his or her experience.

When the wafer W is transferred in accordance with the transfer schedule, a cycle time required to carry out one cycle of the transfer schedule is determined. The cycle time is generally determined as a limiting time to be the longest one of necessary transfer cycle times. The necessary transfer cycle time is obtained for each type of module for carrying out a same process by dividing a necessary staying time from when the wafer W is transferred to a module by the transfer unit 15A (15B) until when the wafer W is ready to be transferred from the module by the transfer unit 15A (15B) after the process is finished in the module by the number of the modules for the same process. Because the necessary transfer cycle time is usually longer than a time period required for the transfer unit 15A (15B) to successively deliver the wafer W to all the accessible modules in the process block 1B, the limiting time is determined to be the longest necessary transfer cycle time among others, as stated above.

For example, when it is assumed that the coater/developer has three coating modules whose necessary staying time is 60 seconds and nine heating modules to be used for pre-baking whose necessary staying time is 90 seconds, the necessary transfer cycle times for the coating and for the pre-baking processes are 20 seconds (=60/3) and 10 seconds (=90/9), respectively. In this case, a cycle limiting time is the necessary transfer cycle time for the coating process, which is longer than the necessary transfer cycle time for the pre-baking process.

On the other hand, only six of the nine heating modules (LHP) are necessary for the following reasons. When a first wafer W1 is delivered to a first heating module LHP1 and then a second wafer W2 is delivered to a second heating module LHP2, the remaining time for the first wafer W1 to be heated in the first heating module LHP1 is 70 seconds. When a third wafer W3 is delivered to a third heating module LHP3, the remaining time for the first wafer W1 is 50 seconds. When a fourth wafer W4 is delivered to a fourth heating module LHP4, the remaining time for the first wafer W1 is 30 seconds. When a fifth wafer W5 is delivered to a fifth heating module LHP5, the remaining time for the first wafer W1 is 10 seconds. Then, a sixth wafer W6 is delivered to the first heating module LHP1 rather than a sixth heating module LHP6. This is because the heating process for the first wafer W1 is finished by then and the wafer W1 is transferred out from the first heating module LHP1, leaving the first heating module LHP1 ready for the sixth wafer W6.

Therefore, even when the operator selects nine heating modules, only six heating modules are used and the remaining three heating modules continue to be in an idle state. This situation takes place quite often because the number of modules to be used is determined in accordance with the operator's experience, as stated above.

What is worse in this situation is that all the nine heating modules start to be heated to 90° C. through 130° C. when selected by the operator, which leads to a waste of electricity, an increased running cost and thus an increased fabrication cost.

The inventors of the present invention are trying to reduce the waste of electricity and the running cost, which may be caused from the fact that temperature control is carried out in, for example, the heating modules that are not planned to be used. Patent-related Document 1 fails to disclose or suggest a way of reducing the waste of electricity and the running cost.
Patent-related Document 1: Japanese Patent Application Laid-Open Publication No. 2004-193597.

SUMMARY OF THE INVENTION

The present invention has been made in view of above, and is directed to a technology that is capable of reducing the waste of electricity and the running cost in a coater/developer.

A first aspect of the present invention provides a coater/developer apparatus having a carrier block where a carrier housing plural substrates is placed and that has a transfer unit for transferring a substrate into and out from the carrier, and a process block where a coating film is formed on the substrate transferred from the carrier by the transfer unit and a developing process is carried out with respect to the substrate after an exposure process, wherein the process block includes plural liquid process modules where a coating solution is coated on the substrate, plural heating modules where the substrate is heated, plural temperature control modules where a temperature of the substrate is controlled, and a substrate transferring unit configured to transfer a first substrate out from a first module of the plural liquid process modules, the plural heating modules, and the plural temperature control modules, the first substrate having been processed in the first module, and transfer a second substrate into the first module, the second substrate having been processed in a second module located upstream from the first module by one process step in a wafer transfer route. The coater/developer apparatus includes a transfer flow producing portion that produces, in accordance with a process recipe concerning the carrier in the carrier block, a transfer flow where a type of the modules listed in accordance with a substrate transfer order in the transfer flow is associated with a necessary staying time from when the substrate is transferred into any one of the modules by the substrate transfer unit to when the substrate undergoes a corresponding process in the module and is ready to be transferred back to the substrate transfer unit, the necessary staying time being determined corresponding to the type of the modules; a cycle limiting time determining portion that calculates a necessary transfer cycle time by dividing the necessary staying time by the number of the corresponding modules mounted in the coater/developer apparatus, the necessary transfer cycle time being obtained with respect to the modules listed in the transfer flow, and determines the longest necessary transfer cycle time to be a cycle limiting time; and a determining portion that calculates a value by dividing the necessary staying time by the cycle limiting time and determines the number of the modules to be used to be one of the value and a nearest integer to which the value is raised, the number of the modules to be used being determined with respect to the modules listed in the transfer flow.

A second aspect of the present invention provides a coater/developer apparatus having a carrier block where a carrier housing plural substrates is placed and that has a transfer unit for transferring a substrate into and out from the carrier, and a process block where a coating film is formed on the substrate transferred from the carrier by the transfer unit and a developing process is carried out with respect to the substrate after an exposure process, wherein the process block includes plural liquid process modules where a coating solution is coated on the substrate, plural heating modules where the substrate is heated, plural temperature control modules where a temperature of the substrate is controlled, and a substrate transferring unit configured to transfer a first substrate out from a first module of the plural liquid process modules, the plural heating modules, and the plural temperature control modules, the first substrate having been processed in the first module, and transfer a second substrate into the first module, the second substrate having been processed in a second module located upstream from the first module by one process step in a wafer transfer route. The coater/developer apparatus includes a transfer flow producing portion that produces, in accordance with a process recipe concerning the carrier in the carrier block, a transfer flow where a type of the modules listed in accordance with a substrate transfer order in the transfer flow is associated with a necessary staying time from when the substrate is transferred into any one of the modules by the substrate transfer unit to when the substrate undergoes a corresponding process in the module and is ready to be transferred back to the substrate transfer unit, the necessary staying time being determined corresponding to the type of the modules; a cycle limiting time determining portion that determines the cycle limiting time to be a necessary transfer cycle time obtained by dividing the necessary staying time in a coating module that coats a resist solution on the substrate and is included in the plural liquid process modules by the number of the coating modules mounted in the coater/developer apparatus; and a determining portion that calculates the necessary transfer cycle time with respect to the modules listed in the transfer flow in accordance with the listing order, determines the number of the modules to be used to be one of a value obtained by dividing the necessary staying time by the cycle limiting time and a nearest integer to which the value is raised when the necessary transfer cycle time is less than or equal to the cycle limiting time, and determines the necessary transfer cycle time to be a new cycle limiting time when the necessary transfer cycle time is greater than the cycle limiting time and then determines the number of the modules to be used to be one of a value obtained by dividing the necessary staying time by the new cycle limiting time and a nearest integer to which the value is raised.

A third aspect of the present invention provides a coater/developer apparatus according to the second aspect, wherein the determining portion recalculates the number of the modules to be used with respect to the modules listed in the transfer flow in the listing order after the determining portion calculates the number of the modules to be used with respect to the modules listed in the transfer flow in the listing order.

A fourth aspect of the present invention provides a coating/developing method carried out in a coater/developer apparatus having a carrier block where a carrier housing plural substrates is placed and that has a transfer unit for transferring a substrate in and out from the carrier, and a process block where a coating film is formed on the substrate transferred from the carrier by the transfer unit and a developing process is carried out with respect to the substrate after an exposure process, wherein the process block includes plural liquid process modules where a coating solution is coated on the substrate, plural heating modules where the substrate is heated, plural temperature control modules where a temperature of the substrate is controlled, and a substrate transferring unit configured to transfer a first substrate out from a first module of the plural liquid process modules, the plural heating modules, and the plural temperature control modules, the first substrate having been processed in the first module, and transfer a second substrate in the first module, the second substrate having been processed in a second module located upstream from the first module by one process step in a wafer transfer route. The coating/developing method includes steps of producing, in accordance with a process recipe concerning the carrier in the carrier block, a transfer flow where a type of the modules listed in accordance with a substrate transfer order in the transfer flow is associated with a necessary staying time from when the substrate is transferred into any one of the modules by the substrate transfer unit to when the substrate undergoes a corresponding process in the module and is ready to be transferred back to the substrate transfer unit, the necessary staying time being determined corresponding to the type of the modules; calculating a necessary transfer cycle time by dividing the necessary staying time by the number of the corresponding modules mounted in the coater/developer apparatus, the necessary transfer cycle time being obtained with respect to the modules listed in the transfer flow, thereby determining the longest necessary transfer cycle time to be a cycle limiting time; and calculating a value by dividing the necessary staying time by the cycle limiting time, thereby determining the number of the modules to be used to be one of the value and a nearest integer to which the value is raised, the number of the modules to be used being determined with respect to the heating modules listed in the transfer flow.

A fifth aspect of the present invention provides a coating/developing method carried out in a coater/developer apparatus having a carrier block where a carrier housing plural substrates is placed and that has a transfer unit for transferring a substrate in and out from the carrier, and a process block where a coating film is formed on the substrate transferred from the carrier by the transfer unit and a developing process is carried out with respect to the substrate after an exposure process, wherein the process block includes plural liquid process modules where a coating solution is coated on the substrate, plural heating modules where the substrate is heated, plural temperature control modules where a temperature of the substrate is controlled, and a substrate transferring unit configured to transfer a first substrate out from a first module of the plural liquid process modules, the plural heating modules, and the plural temperature control modules, the first substrate having been processed in the first module, and transfer a second substrate into the first module, the second substrate having been processed in a second module located upstream from the first module by one process step in a wafer transfer route. The coating/developing method includes steps of producing, in accordance with a process recipe concerning the carrier in the carrier block, a transfer flow where a type of the modules listed in accordance with a substrate transfer order in the transfer flow is associated with a necessary staying time from when the substrate is transferred into any one of the modules by the substrate transfer unit to when the substrate undergoes a corresponding process in the module and is ready to be transferred back to the substrate transfer unit, the necessary staying time being determined corresponding to the type of the modules; determining the cycle limiting time to be a necessary transfer cycle time obtained by dividing the necessary staying time in a coating module that coats a resist solution on the substrate and is included in the plural liquid process modules by the number of the coating modules mounted in the coater/developer apparatus; and calculating the necessary transfer cycle time with respect to the modules listed in the transfer flow in accordance with the listing order, determining the number of the heating modules to be used to be one of a value obtained by dividing the necessary staying time in the heating modules by the cycle limiting time and a nearest integer to which the value is raised when the necessary transfer cycle time is less than or equal to the cycle limiting time, and determining the necessary transfer cycle time to be a new cycle limiting time when the necessary transfer cycle time is greater than the cycle limiting time and then determining the number of the heating modules to be used to be one of a value obtained by dividing the necessary staying time in the heating modules by the new cycle limiting time and a nearest integer to which the value is raised.

A sixth aspect of the present invention provides a coating/developing method according to the fifth aspect, further comprising a step of recalculating the number of the modules to be used with respect to the modules listed in the transfer flow in the listing order after the step of calculating the number of the modules to be used with respect to the modules listed in the transfer flow in the listing order.

A seventh aspect of the present invention provides a computer readable storing medium storing a computer program for use in a coater/developer apparatus wherein a coating film is formed on a substrate transferred from a carrier that houses plural substrates and is placed in a carrier block and a developing process is carried out with respect to the substrate in a process block after an exposure process, the computer program comprising a group of steps so that the coating/developing method according to any one of the fourth through the sixth aspects is carried out.

According to an embodiment of the present invention waste of electricity and running cost can be reduced because the number of modules to be used can be automatically determined in a coater/developer.

BRIEF DESCRIPTION OF THE DRAWINGS

These and other objects, features, and advantages of the present invention will become more apparent from the following detailed description of preferred embodiments given with reference to the accompanying drawings.

FIG. 9 is an example of a transfer flow in the coater/developer according to the embodiment of the present invention;

FIG. 12 is an example of a transfer flow in the coater/developer according to the embodiment of the present invention;

DETAILED DESCRIPTION OF THE PREFERRED EMBODIMENT

Figure 1:
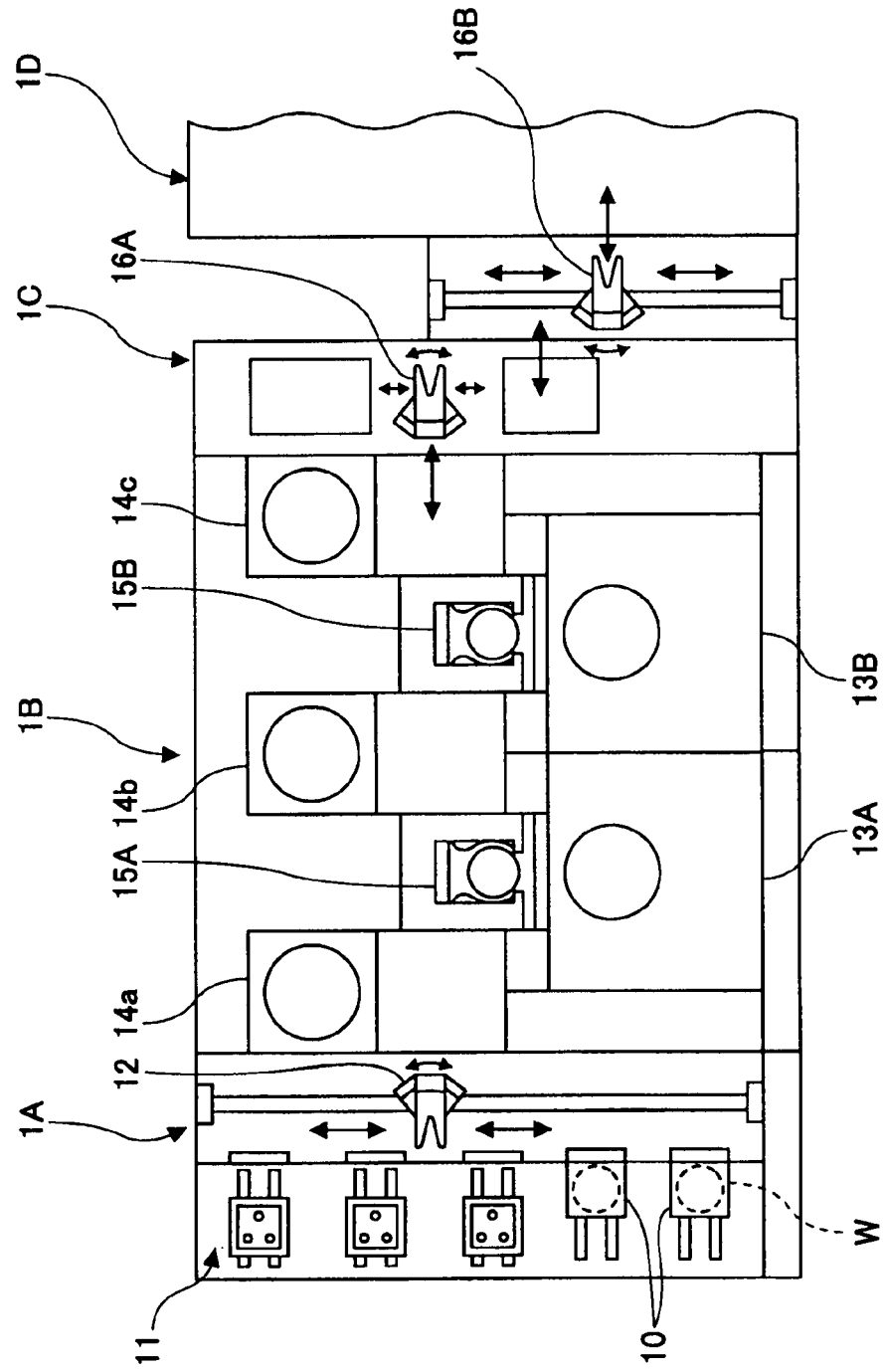
FIG. 1 is a plan view of a related art coater/developer.

Non-limiting, exemplary embodiments of the present invention will now be described with reference to the accompanying drawings. In the drawings, the same or corresponding reference marks are given to the same or corresponding members or components and hence repetitive explanations are omitted. It is to be noted that the drawings are illustrative of the invention, and there is no intention to indicate scale or relative proportions among the members or components. Therefore, the specific size should be determined by a person having ordinary skill in the art in view of the following non-limiting embodiments.

Figure 2:
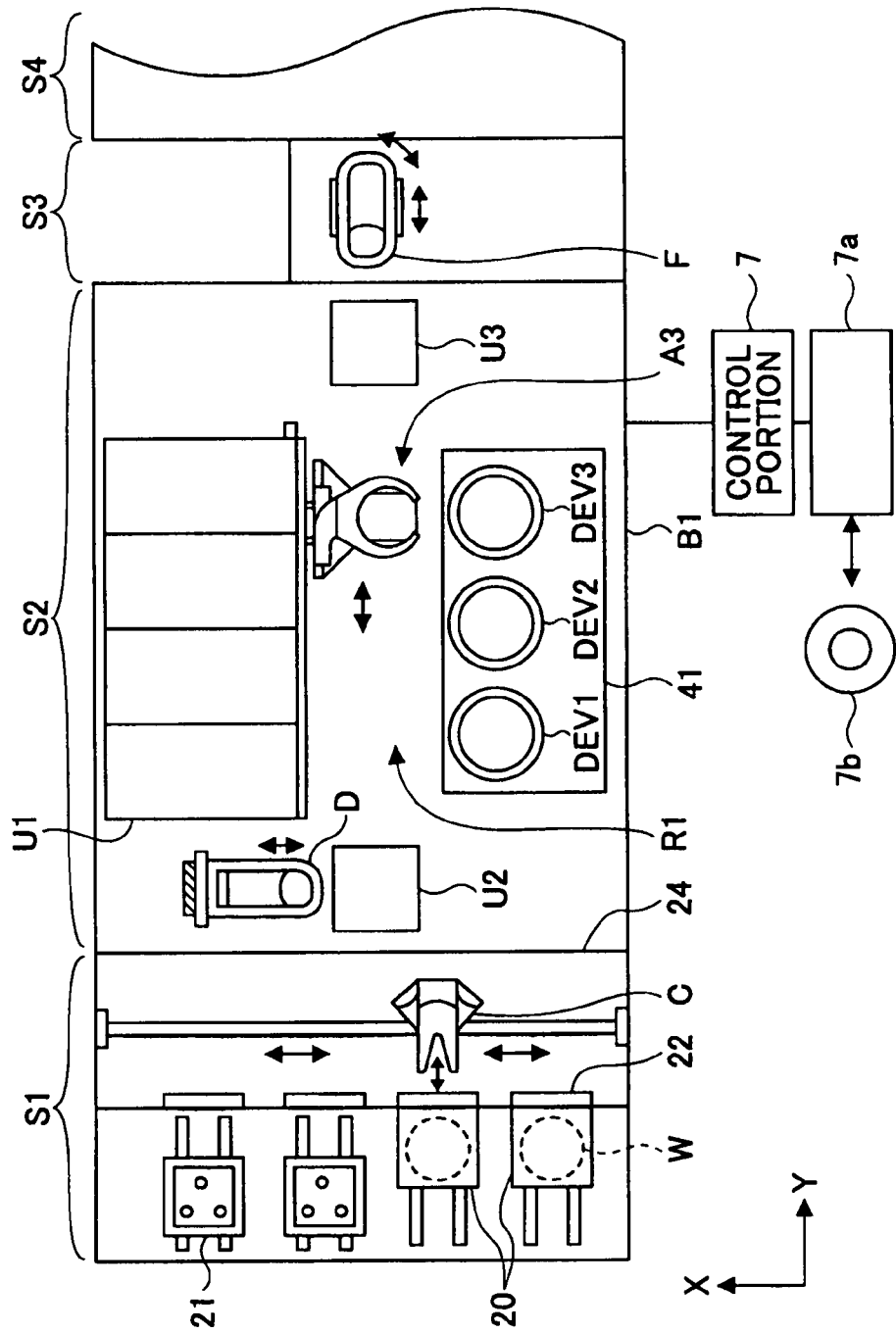
FIG. 2 is a plan view of a coater/developer according to an embodiment of the present invention.
Figure 3:
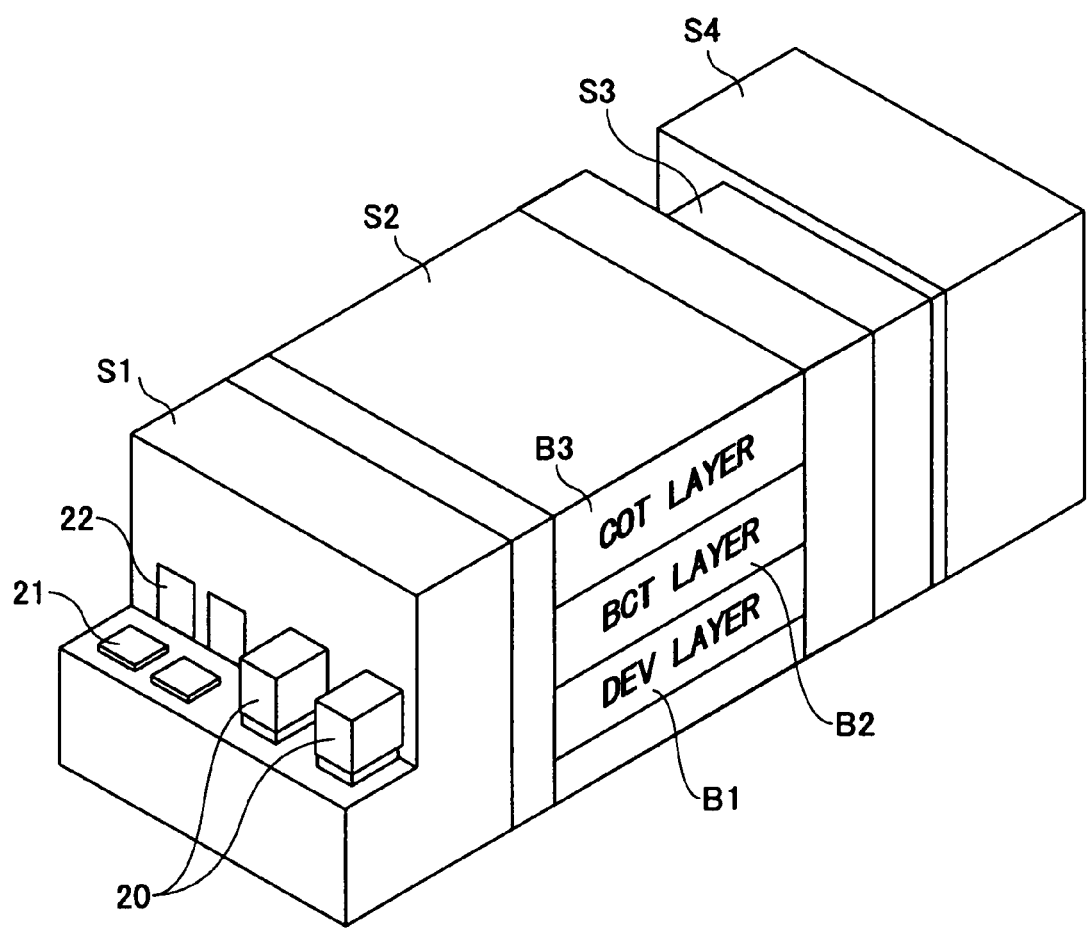
FIG. 3 is a perspective view of the coater/developer according to the embodiment of the present invention.
Figure 4:
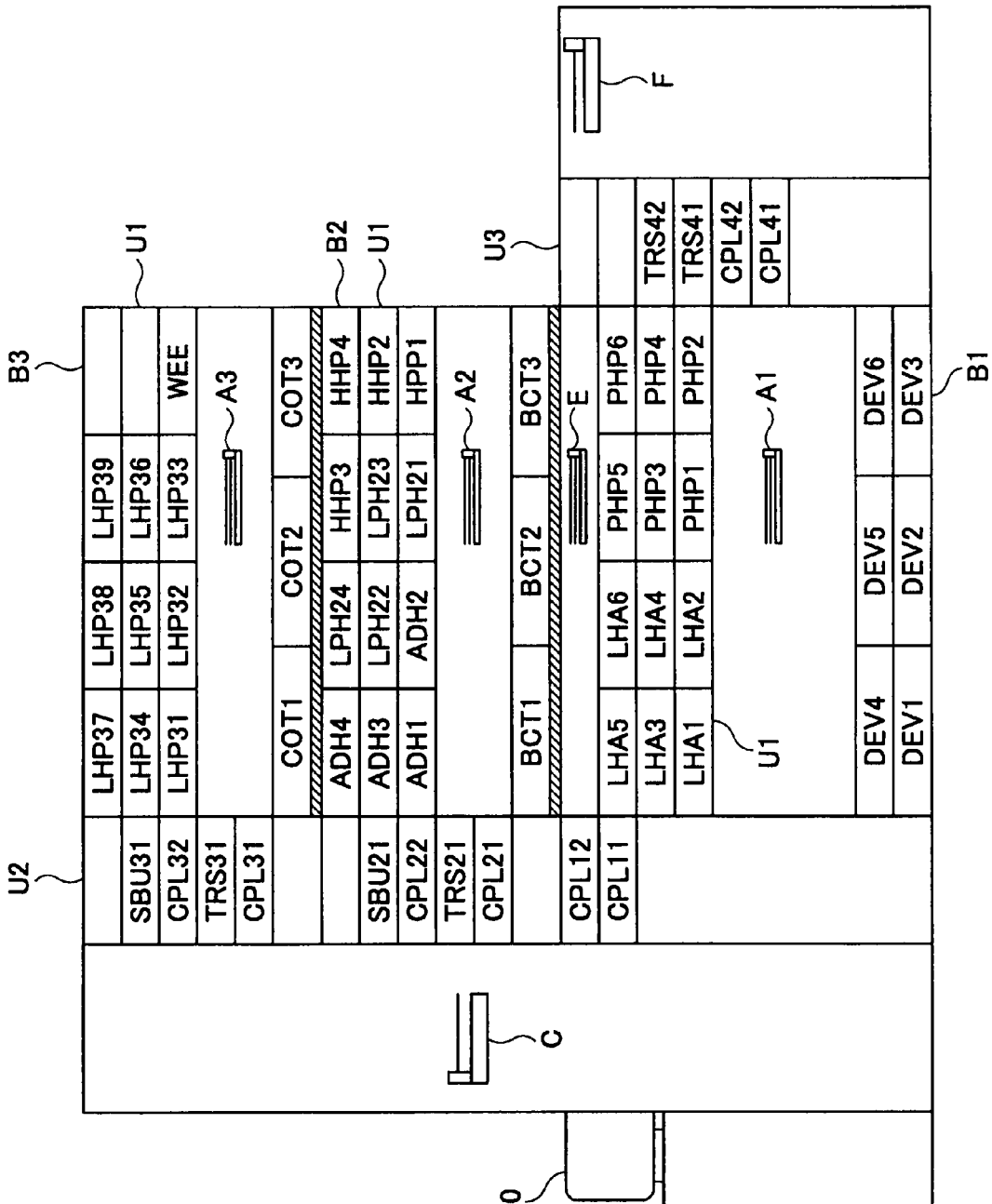
FIG. 4 is a cross-sectional view of the coater/developer according to the embodiment of the present invention.

Referring to the accompanying drawings, a resist pattern forming apparatus including a coater/developer according to an embodiment of the present invention is described. FIG. 2 is a plan view of the resist pattern forming apparatus. FIG. 3 is a perspective view of the resist pattern forming apparatus of FIG. 2. FIG. 4 is a side view of the resist pattern forming apparatus of FIG. 2. The resist pattern forming apparatus includes a carrier block S1 where a carrier 20 housing plural wafers (e.g., 13 wafers) W in an airtight manner are placed, a process block S2 having plural unit blocks (e.g., 3 unit blocks) B1 through B3 arranged in a row, an interface block S3, and an exposure apparatus S4.

The carrier block S1 includes a carrier stage 21 on which the plural carriers 20 are placed, an opening/closing portion 22 located on a front wall that can be seen from the carrier stage 21, and a transfer arm C serving as a wafer transfer unit for transferring the wafer W into and out from the carrier 20 through the opening/closing portion 22. The transfer arm C is movable forward/backward and upward/downward, pivotable around a vertical axis, and shiftable along a direction in which the carriers 20 are arranged, so that the wafer W can be transferred into and out from the unit blocks B1 and B2.

The carrier block S1 is connected at a back wall to the process block S2 surrounded by a chassis 24. As shown in FIG. 3, the process block S2 is sectioned into a first unit block (developer (DEV) layer) B1 where a developing process is carried out, a second unit block (bottom coating (BCT) layer) B2 where a bottom anti-reflection film is coated, and a third unit block (coating (COT) layer) B3 where a resist film is coated on the bottom anti-reflection film, in this order from below in the illustrated example.

Referring to FIG. 4, these unit blocks B1 through B3 have substantially the same configuration. Namely, the unit blocks B1 through B3 have liquid process modules for coating a coating solution on the wafer W, a shelf unit U1 where various modules such as heating modules to be used for carrying out a pre-treatment and a post-treatment for the wafer W are stacked one above another, and a corresponding one of main arms A1 through A3 serving as a wafer transfer unit that transfers the wafer W between the liquid process modules and the shelf unit U1.

In an area of the unit blocks B1 through B3 adjacent to the carrier block S1, a shelf unit U2 is provided so that the transfer arm C in the carrier block S1 and the main arms A1 through A3 in the process block S2 can access the shelf unit U2, as shown in FIGS. 2 and 4. The shelf unit U2 has first passage portions through which the wafer W can be transferred between the unit blocks B1 through B3. In addition, a transfer arm D is provided next to the shelf unit U2. The transfer arm D is movable forward/backward and upward/downward so that the wafer W is transferred between the passage portions of the shelf unit U2 by the transfer arm D. Moreover, in an area of the unit block (DEV layer) B1 adjacent to the interface block S3, a shelf unit U3 is provided so that the main arm A1 of the DEV layer B1 can access the shelf unit U3, as shown in FIGS. 2 and 4. The shelf unit U3 has second passage portions through which the wafer W can be transferred between the process block S2 and the interface block S3.

Behind the process block S2, an exposure apparatus S4 is connected to the process block S2 via the interface block S3. In the interface block S3, an interface arm F is provided so that the wafer W is transferred between the second passage portions of the shelf unit U3 of the DEV layer B1 and the exposure apparatus S4 by the interface arm F. The interface arm F is movable forward/backward and upward/downward and pivotable around a vertical axis.

Next, the DEV layer B1 is explained in detail, referring to FIGS. 2 through 5. In the center portion of the DEV layer B1, there is a transfer area R1 provided along a longitudinal direction of the DEV layer B1 (Y direction in FIG. 2). Along the transfer area R1 on the right hand side when viewed from the carrier block S1, developing modules DEV1 through DEV3 are arranged as the liquid process modules where a developing process is carried out. In addition, developing modules DEV4 through DEV6 are arranged above the developing modules DEV1 through DEV 3, respectively, as shown in FIG. 4.

On the other side of these developing modules DEV, the shelf unit U1 having plural process modules in a 3×4 arrangement is located. The shelf unit U1 includes, for example, six heating modules PHP1 through PHP6, which may be called "post-exposure baking modules" where the wafer W is heated after the exposure, and, for example, six heating modules LHA1 through LHA6, which may be called "post-baking module" where the wafer W is heated in order to expel moisture from the developed resist film.

As shown in FIG. 4, in an area of the shelf unit U2 corresponding to the DEV layer B1, temperature control modules CPL11 and CPL12 for controlling the wafer temperature are provided that serve as the first passage portions. The transfer arm C, the main arm A1, and the transfer arm D can access the temperature control module CPL11. The transfer arm D and a shuttle arm E (described below) can access the temperature control module CPL12.

In the shelf unit U3, temperature control modules CPL41, CPL42 and transfer modules TRS41, TRS42 are provided in this order from below that serve as the second passage portions. The main arm A1 and the interface arm F can access these modules CPL41, CPL42, TRS41, and TRS42.

Next, the main arm A1 provided in the transfer area R1 is described. The main arm A1 transfers the wafer between all the modules in the DEV layer B1, or all the places where the wafer W is supposed to be placed. The main arm A1 is movable forward/backward and upward/downward, pivotable around a vertical axis, and shiftable along the Y direction.

Figure 5:
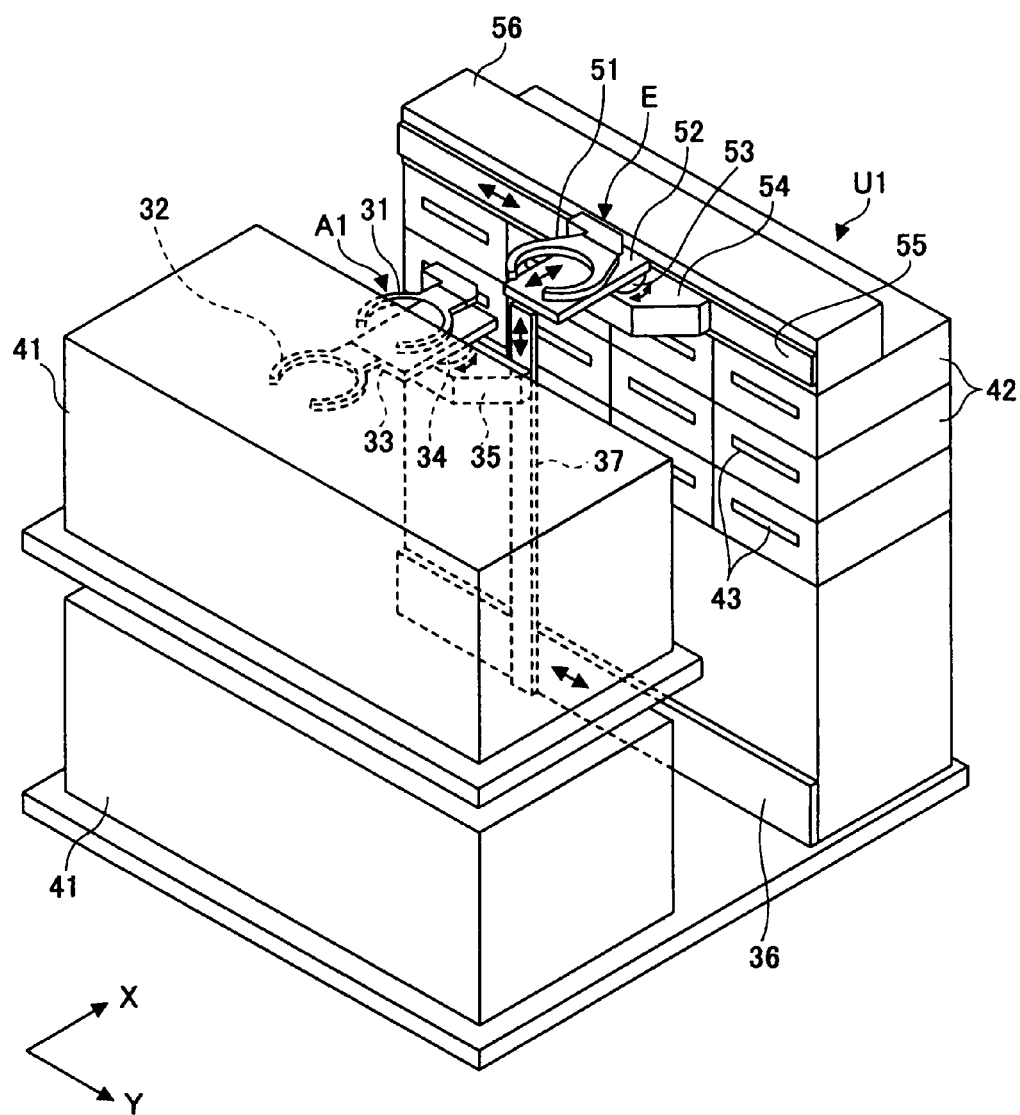
FIG. 5 is a perspective view of a unit block (DEV layer) in the coater/developer according to the embodiment of the present invention.

The main arm A1 includes two support arms 31, 32 that support a back side circumferential area of the wafer W as shown in FIG. 5. The support arms 31, 32 are located above a base 33 and independently movable in relation to each other. The base 33 is located above a transfer base body 35 and rotatable around a vertical axis by a rotation mechanism. In FIG. 5, "36" denotes a guide rail extending along a longitudinal direction of the transfer area R1, which corresponds to the Y direction in FIG. 2, and "37" denotes an elevation guide rail. The transfer base body 35 is movable upward/downward along the elevation guide rail 37. The elevation guide rail 37 is bent at a lower portion into an L-shape and the bent portion of the elevation guide rail 37 is inserted below the guide rail 36 so that the elevation guide rail 37 stands upright. The elevation guide rail 37 is movable along the guide rail 36 so that the transfer base body 35 is movable in the longitudinal direction of the transfer area R1. When the wafer W is transferred to each process module of the shelf unit U1, the elevation guide rail 37 is located at a position where the elevation guide rail 37 does not block the support arms 31, 32 from accessing the process module. In FIG. 5, "41" denotes housing chambers, each of which houses the three developing modules, "42" denotes housing chambers for the process modules, and "43" denotes transfer openings of the housing chambers 42. The wafer W is transferred into and out from each of the housing chambers 42 through the corresponding transfer opening of the chamber 42.

The shuttle arm E is a transfer unit arranged in an upper space of the DEV layer B1 and transfers the wafer W exclusively between the shelf unit U2 and the shelf unit U3. As shown in FIG. 5, the shuttle arm E includes a support arm 51 that supports the back side circumferential area of the wafer W and moves the wafer W along a base 52. The base 52 is located above a transfer base body 54 and rotatable around a vertical axis by a rotation mechanism. The transfer base body 54 is movably attached on a guide rail 55 provided on a side face of a support member 56 arranged at an upper portion of the shelf unit U1, the side face facing the transfer area R1, so that the transfer base body 54 can move along the longitudinal direction of the transfer area R1. With such a configuration, the shuttle arm E can access the temperature control module CPL12 of the shelf unit U2 and deliver the wafer W directly to the interface arm F through an open space in the shelf unit U3 (FIG. 4).

The BCT layer B2 is different from the DEV layer B1 in that the BCT layer B2 includes three liquid process modules, no shuttle arm E, and no shelf unit U3, while the BCT layer B2 is the same as the DEV layer B1 in terms of the other components or units. Three anti-reflection film coating modules BCT1 through BCT3 as the liquid process modules are configured to dispense a solution of an anti-reflection film onto the wafer W in order to form the anti-reflection film. The shelf unit U1 includes plural (e.g., four) hydrophobizing process modules ADH1 through ADH4 where the wafer W undergoes a hydrophobizing process, plural (e.g., four) heating modules LHP21 through LHP24 where the wafer W is heated after the anti-reflection film is coated on the wafer W, and plural (e.g., four) combination ovens or heating modules HHP1 through HHP4.

The shelf unit U2 includes in the area corresponding to the BCT layer B2 temperature control modules CPL21, CPL22, a transfer module TRS21, and a buffer module SBU21 where plural wafers W are housed. These modules CPL21, CPL22, TRS21, SBU21 serve as the first passage portions. The wafer W is transferred between the anti-reflection film coating modules BCT1 through BCT3, the shelf unit U1, and the shelf unit U2 by the main arm A2. In addition, not only the main arm A2 but also the transfer arm D (FIG. 2) can access each module in the shelf unit U2. Moreover, the transfer arm C in the carrier block S1 (FIG. 2) can access the transfer module TRS21.

The COT layer B3 is configured in substantially the same manner as the BCT layer B2. The COT layer B3 includes three coating modules COT1 through COT5 as the liquid process modules that dispense resist solution onto the wafer W in order to form a resist film. The shelf unit U1 includes plural (e.g., nine) heating modules LHP31 through LHP39 where the wafer W is heated after the resist film is formed, and a wafer edge exposure module WEE. The heating modules LHP may include a heating plate for heating the wafer W placed on the heating plate and a cooling plate serving also as a transfer arm that can deliver the wafer W from the heating module to the main arm A3. Namely, the heating modules LHP may be configured to heat and cool the wafer W.

The shelf unit U2 includes in an area corresponding to the COT layer B3 temperature control modules CPL31, CPL32, a transfer module TRS31, a buffer module SBU31, which are stacked one above another and serve as the first passage portions. The wafer W can be transferred between the coating modules COT1 through COT3, the shelf unit U1, and the shelf unit U2 by the main arm A3. In addition, not only the main arm A3 but also the transfer arm D can access each module in the shelf unit U2.

Figure 6:
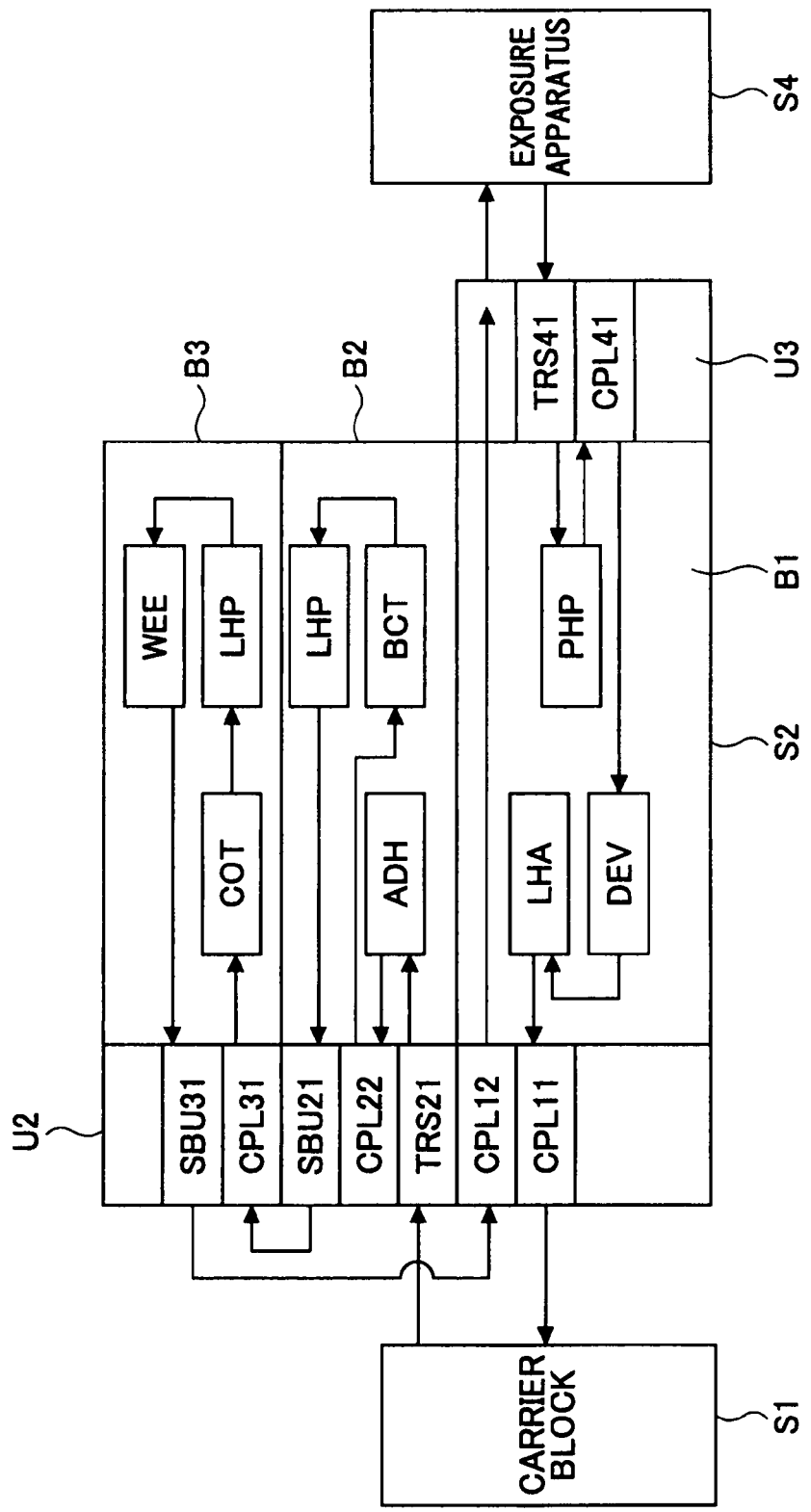
FIG. 6 is a schematic cross-sectional view for showing an example of a wafer transfer route in the coater/developer according to the embodiment of the present invention.

Next, operations of the resist pattern forming apparatus as configured above are explained with reference to FIG. 6, where the anti-reflection film and the resist film are formed as coating films on the wafer W. First, the wafer W housed in the carrier 20 that is transferred into the carrier block S1 from outside is delivered to the BCT layer B2 through the transfer module TRS21 of the shelf unit U2 by the transfer arm C. The wafer W is then transferred through any one of the hydrophobizing process modules ADH1 through ADH4, the temperature control module CPL22 (21), any one of the anti-reflection film forming modules BCT1 through BCT3, and any one of the heating modules LHP21 through LHP24 in this order by the main arm A2. As a result, the anti-reflection film is formed on the wafer W.

Next, the wafer W is transferred by the main arm A2 to the buffer module SBU21 of the shelf unit U2. The wafer W is then transferred from the buffer module SBU21 to the temperature control module CPL31 (32) of the shelf unit U2 by the transfer arm D. Continuously, the wafer W is transferred through any one of the coating modules COT1 through COT3, any one of the heating modules LHP31 through LHP39, the wafer edge exposure module WEE in this order by the main arm A3 of the COT layer B3. As a result, the resist film is formed on the anti-reflection film.

Next, the wafer W is transferred from the wafer edge exposure module WEE to the buffer module SBU31 by the main arm A3, and from the buffer module SBU31 to the temperature control module CPL12 of the shelf unit U2 by the transfer arm D. Then, the wafer W is taken out from the temperature control module CPL12 by the shuttle arm E. Then, the wafer W held by the shuttle arm E is received by the interface arm F of the interface block S3, and then transferred to the exposure apparatus S4 where the wafer W undergoes an exposure process.

After the exposure process, the wafer W is transferred through the interface arm F, the transfer module TRS41 (42) of the shelf unit U3, and the main arm A1 in this order to the DEV layer B1, where the wafer W is further transferred through any one of the heating modules PHP1 through PHP6, the temperature control module CPL41 (42), any one of the developing modules DEV1 through DEV6, any one of the heating modules LHA1 through LHA6, and the temperature control module CPL11 in this order. As a result, the developing process is finished. Then, the wafer W is transferred back by the transfer arm C to the original carrier 20 placed on the carrier block S1.

The resist pattern forming apparatus also includes a control portion 7 composed of, for example, a computer. The control portion 7 controls the operations of the main arms A1 through A3, the transfer arm C, the transfer arm D, the shuttle arm E, the interface arm E, and other components or parts in each module and manages recipes or programs that control the transfer order of the wafer W and each module. The control portion 7 is connected to a program storing portion 7a that stores computer programs containing groups of steps (instructions) in order to carry out the operations of each module and the wafer transfer operations so that a predetermined resist pattern is formed in the resist pattern forming apparatus. The computer programs are read out from the program storing portion 7a and executed by the control portion 7, so that the resist pattern forming apparatus can operate under control of the control portion 7 in accordance with the computer program. The computer program can be loaded to the program storing portion 7a from a computer readable storing medium 7b through a corresponding input/output (I/O) device (not shown). An example of the computer readable storing medium is a flexible disk, a hard disk, a compact disk, a magneto-optical disk, a memory card, or the like.

Figure 7:
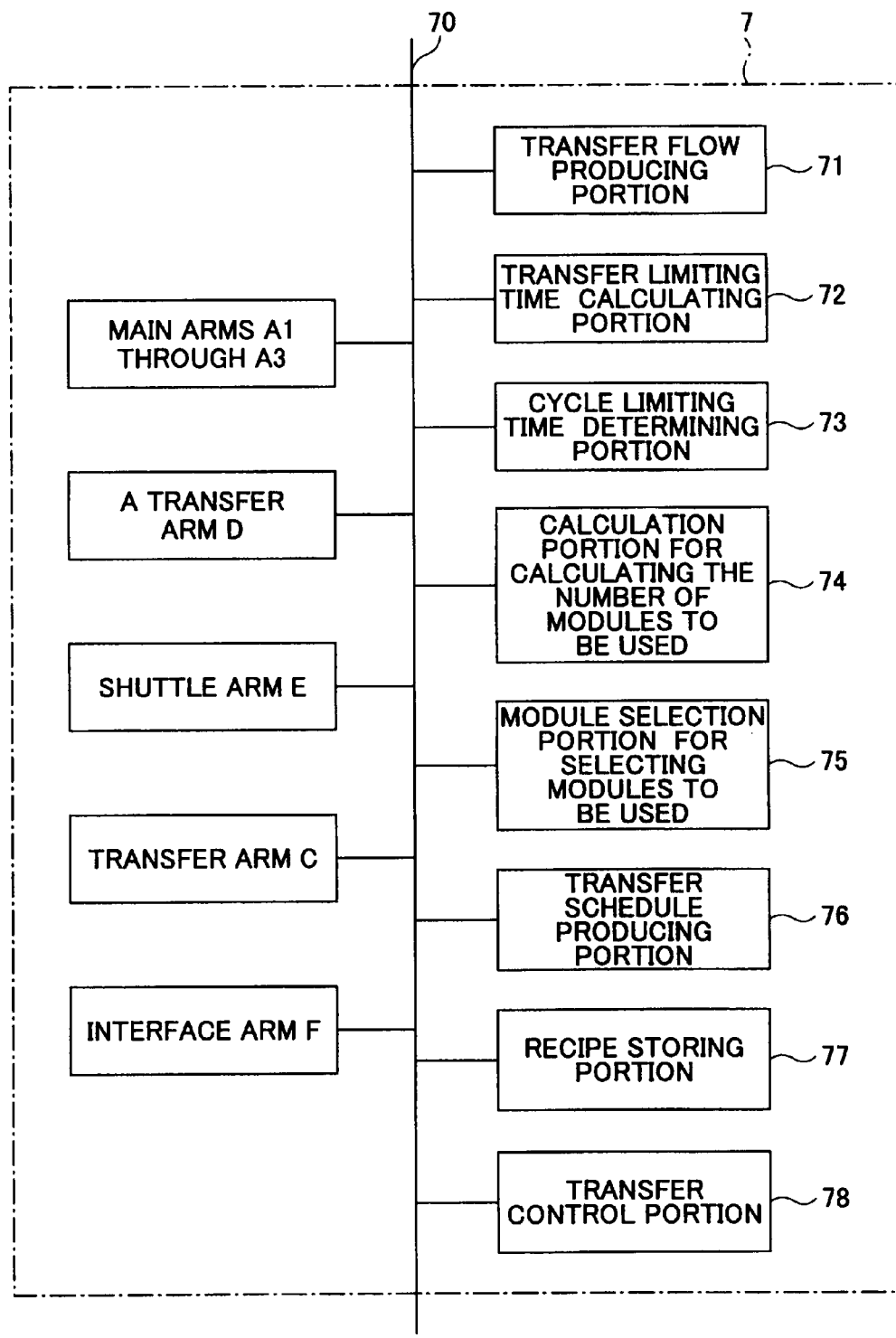
FIG. 7 is a function block diagram of a control portion of the coater/developer according to the embodiment of the present invention.
Figure 8:
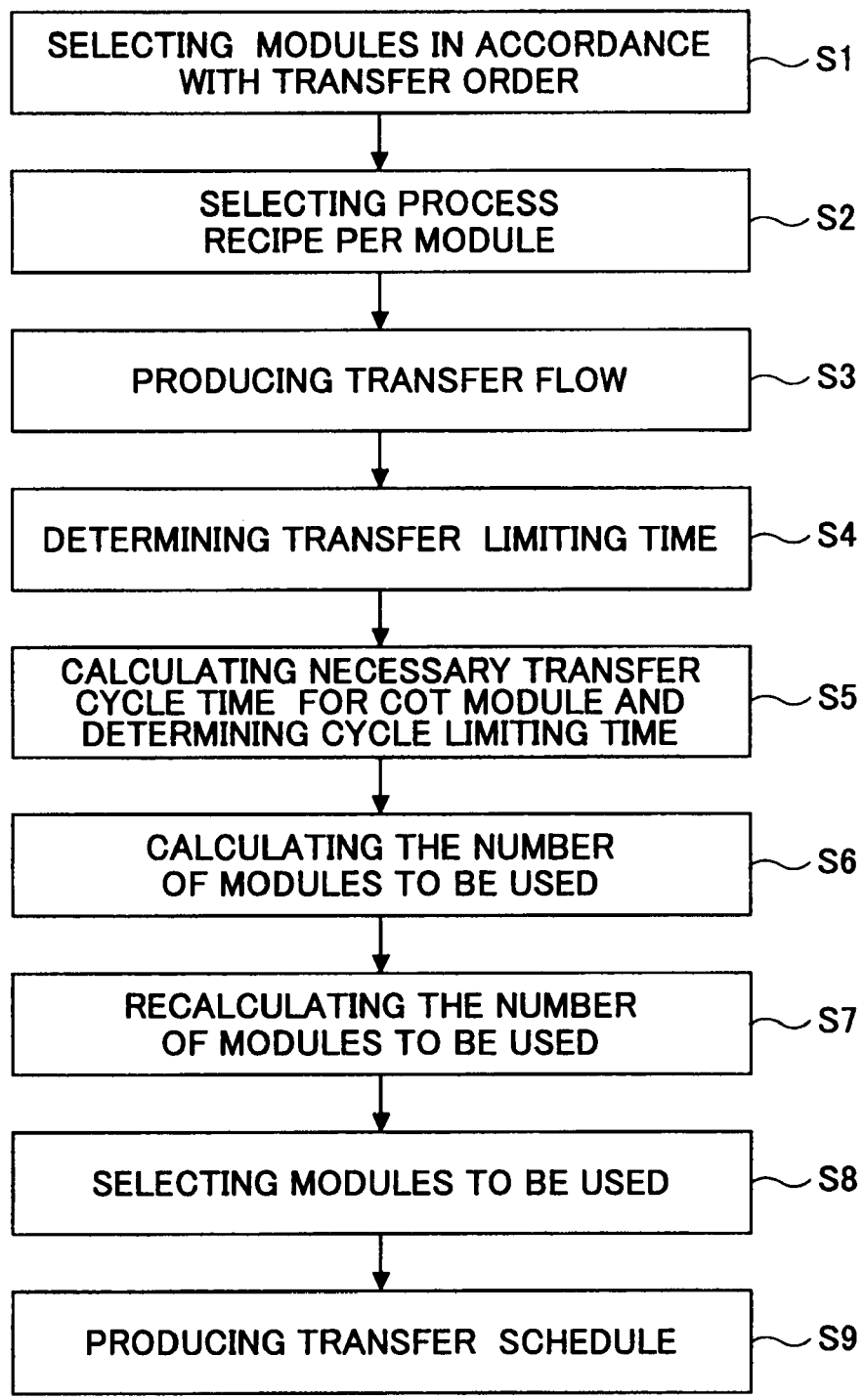
FIG. 8 is a flowchart for explaining a way of calculating the number of modules to be used in the coater/developer according to the embodiment of the present invention.

FIG. 7 illustrates the configuration of the control portion 7. While the control portion 7 is physically composed of a central processing unit (central processing module), a computer program, a memory device and so on, the following explanation is made supposing that the control portion 7 is composed of plural function blocks. In FIG. 7, "70" denotes a bus to which a transfer flow producing portion 71, a transfer limiting time calculating portion 72, a cycle limiting time determining portion 73, a calculation portion 74 for calculating the number of modules to be used, a module selection portion 75 for selecting modules to be used, a transfer schedule producing portion 76, a recipe storing portion 77, and a transfer control portion 78 are connected.

The transfer flow producing portion 71 produces a transfer flow where types of modules listed in accordance with the wafer transfer order are associated with the corresponding necessary staying times. As stated above, the necessary staying time is a period of time from when the wafer W is delivered to a module by the main arms A1 through A3 until when the wafer W is ready to be delivered back to the main arms A1 through A3 after a predetermined process is finished in the module.

For example, when an operator selects, on a computer display, a process recipe that is to manage a process to be carried out for the wafer in the carrier 20 in the carrier block S1 from the process recipes stored in the recipe storing portion 77, the transfer flow is made in accordance with the selected process recipe. Namely, the process recipe includes a transfer recipe that determines types of modules to which the wafer W is to be transferred in accordance with a predetermined wafer transfer order, and a processing recipe that determines types of processes carried out in the corresponding modules. With this, when the process recipe is selected, the types of modules and the necessary staying time are automatically selected, so that the transfer flow is produced. Alternatively, the transfer flow may be produced in such a way that the operator selects the types of modules and the necessary staying time by choosing the types of modules to which the wafer W is to be transferred in the wafer transfer order and then the types of processes carried out in the corresponding modules on a computer screen. In this case, the modules selected by the operator are, for example, the coating module COT, the heating module LHP, and the like, rather than the individual coating module COT1, the individual heating module LHP1, and the like.

The necessary staying time is defined as a minimum time period from when the main arm A (A1 through A3) delivers the wafer W to a certain module until when the wafer W undergoes the corresponding process in the module and is ready to be delivered back to the main arm A, during which the wafer W stays in the module, as stated above. Delivering the wafer W to a certain module by the main arm A means that the wafer W is placed on lift pins provided in a wafer receiving portion of the module from the main arm A. The wafer W being ready to be delivered back to the main arm A after the corresponding process is finished means that the wafer W is raised by the lift pins in order to deliver the wafer W back to the main arm A after the process is finished.

The transfer limiting time calculating portion 72 calculates the necessary transfer time for each of the main arms A1 through A3 in accordance with the number of the modules that the corresponding arms A1 through A3 can access, and then determines the longest necessary transfer time as the transfer limiting time. Because a transfer speed of the main arms A1 through A3 are determined to be constant in advance, the necessary transfer time becomes longer as the number of the modules that can be accessed by the corresponding main arms A1 through A3 increases, and, conversely, the necessary transfer time becomes shorter as the number of the accessible modules decreases.

The cycle limiting time determining portion 73 determines the necessary transfer cycle time obtained by dividing the necessary staying time by the number of the coating modules COT mounted in the resist pattern forming apparatus according to this embodiment to be a cycle limiting time. The cycle limiting time is a period of time necessary to carry out one cycle of the transfer schedule when the wafer W is transferred in accordance with the transfer schedule.

The calculation portion 74 for calculating the number of modules to be used calculates the necessary transfer cycle time for all the modules listed in the transfer flow in accordance with the listing order. Then, the calculation portion 74 determines the number of, for example, the heating modules to be used to be a value obtained by dividing the necessary staying time in the heating module by the cycle limiting time, or a nearest integer to which this value is raised (instead of the value) when the necessary transfer cycle time is less than or equal to the cycle limiting time. Alternatively, the calculation portion 74 determines a new cycle limiting time to be the calculated necessary transfer cycle time when the necessary transfer cycle time is larger than the cycle limiting time, and determines the number of, for example, the heating modules to be used to be a value obtained by dividing the necessary staying time in the heating module by the new cycle limiting time, or a nearest integer to which this value is raised (instead of the value).

The module selection portion 75 selects modules to be used in accordance with the determined number of the modules to be used. For example, the modules to be used are selected on the computer screen by the operator.

The transfer schedule producing portion 76 produces a transfer schedule in accordance with the transfer flow, the selected modules to be used, and the process recipe to be executed in each module. The transfer schedule determines a transfer timing at which each of the wafers W included in a lot is transferred to a predetermined module. Specifically, the transfer schedule is produced by arranging, in time series, transfer cycle data that specify a transfer cycle by assigning wafer numbers to the corresponding wafers W and associating the wafer number with each module. In this transfer schedule, one cycle of the transfer schedule is carried out in the new cycle limiting time.

The recipe storing portion 77, which corresponds to a memory portion, stores process recipes in which process conditions applied in processing the wafer W are recorded, the transfer flow, the transfer schedule and the like. The transfer control portion 78 refers to the transfer schedule and controls the transfer arm C, the main arms A1 through A3, the transfer arm D, the shuttle arm E, the transfer arm C, and the interface arm F so that the wafer W specified in the transfer cycle data is transferred to the module to which the wafer W has to be transferred, thereby carrying out the transfer cycle.

Next, operational effects of the resist pattern forming apparatus according to this embodiment of the present invention are described with reference to FIGS. 8 through 12. First, the operator selects a process recipe to be executed for the wafers W in the carrier 20 placed on the carrier block S1 on the computer screen. With this, because module types are selected in accordance with a transfer order of the wafers W (Step S1) and a process recipe corresponding to a process to be carried out in each module is selected (Step S2), a transfer flow (table) shown in, for example, FIG. 9 is produced by the transfer flow producing portion 71 (Step S3).

In the transfer flow shown in FIG. 9, the number of the modules mounted in the resist pattern forming apparatus is listed on a module type basis. In addition, the main arms A (A1 through A3) are listed in such a manner that each of the main arms A is associated with the modules that the main arm A concerned can access in the transfer flow. Steps 2 through 7 in the transfer flow are carried out in the BCT layer B2; steps 8 through 12 are carried out in the COT layer B3; and steps 15 through 20 are carried out in the DEV layer B1. Moreover, "ISHU" of a step 13 generically denotes operations of the shuttle arm E from the temperature control module CPL12 to the shuttle arm E. Furthermore, "EIF" of a step 14 denotes the interface arm F. Because the modules to be accessed by each of the main arms A1 through A3 are determined as shown in the transfer flow in FIG. 9, the transfer limiting time calculating portion 72 can calculate the necessary transfer cycle times of the main arms A1 through A3 and determine the longest one of the necessary transfer cycle times to be the transfer limiting time (step S4). In the illustrated example, the necessary transfer time corresponding to the main arms A1 and A3 (16 seconds) is determined to be the transfer limiting time.

Next, the cycle limiting time determining portion 73 calculates the necessary transfer cycle time with respect to the coating module COT, compares the calculated necessary transfer cycle time with the transfer limiting time determined above, and determines the longer one of the calculated necessary transfer cycle time and the transfer limiting time to be the cycle limiting time (step S5). For example, because the necessary staying time for the coating modules COT is 60 seconds and the three coating modules COT are mounted in the resist pattern forming apparatus, the necessary transfer cycle time is 20 seconds (the necessary staying time (60 seconds) divided by the number of the coating modules (3)), which means the necessary transfer cycle time is longer than the transfer limiting time (16 seconds). Therefore, the necessary transfer cycle time is now determined to be the cycle limiting time. However, the number of the modules of the same type can be determined in order that the transfer limiting time of the main arms A is not determined to be the cycle limiting time in order to improve the process throughput. In this case, calculating the transfer limiting time of the main arms A and comparing the calculated necessary transfer cycle time with the transfer limiting time can be omitted, thereby directly determining the necessary transfer cycle time of the coating modules COT to be the cycle limiting time.

Next, the calculation portion 74 for calculating the number of modules to be used obtains the number of the modules of the same type to be used in accordance with the listing order in the transfer flow (step S6). An example of Step S6 is described with reference to flowcharts in FIGS. 10 and 11. First, an instruction is output to start the calculation from a first module listed in the transfer flow at Step S11, and then it is determined whether there is the necessary staying time for the first module at Step S12. When there is not the necessary staying time (Step S12: N), this procedure proceeds to Step S20, where a next instruction is output to calculate the number of the next module in the transfer flow. Because the necessary staying time is not written with respect to the first module, which is the transfer module TRS, in the transfer flow shown in FIG. 9, it is then determined whether there is the necessary staying time for the next module, which is the hydrophobizing process module ADH.

On the other hand, when it is determined at Step S12 that there is the necessary staying time for the module concerned (Step S12: Y), it is determined whether the necessary transfer cycle time for the same module is within the cycle limiting time at Step S13. When the necessary transfer cycle time is within the cycle limiting time (Step S13: Y), this procedure proceeds to Step S14. Alternatively, when the necessary transfer cycle time exceeds the cycle limiting time (Step S13: N), the necessary transfer cycle time for this module is determined to be a new cycle limiting time Step S15, and this procedure returns to Step S13. In the case of the hydrophobizing process modules ADH in the transfer flow in FIG. 9, because the necessary transfer cycle time is 15 seconds (the necessary staying time (60 seconds) divided by the number of the hydrophobizing process modules ADH (4)), the procedure proceeds to Step S14.

At Step S14, m is set to be 1, and then the procedure proceeds to Step S16, where it is determined whether a value obtained by dividing the necessary staying time for the module concerned (e.g., ADH) by (the number of the modules−m) is within the cycle limiting time. When the value is within the cycle limiting time (Step S16: Y), the procedure proceeds to Step S17, where the m is incremented by 1, and then the procedure returns to Step S16. Alternatively, when the value exceeds the cycle limiting time (Step S16: N), the procedure proceeds to Step S18, where the number of the modules to be used is determined by the next expression (1):

the number of the modules to be used=the number of the modules mounted in the resist pattern forming apparatus−*m*+1 (1)

In the case of the hydrophobizing process modules ADH in FIG. 9, it is determined at Step S16 that the value within the cycle limiting time because (the necessary staying time (60 seconds)/(the number of the mounted modules (4)-m (m=1))) is 20 seconds, and m becomes 2 at Step S17. Then, it is determined again at Step S16 whether the value is within the cycle limiting time. In this case, because the value (the necessary staying time (60 seconds)/(the number of the modules (4)-m (m=2))) is 30 seconds, which exceeds the cycle limiting time, and thus the number of the modules to be used is determined at Step S18 in accordance with the expression (1). Namely, the number of the hydrophobizing process modules ADH is determined to be 3 (4−2+1).

Figure 11:
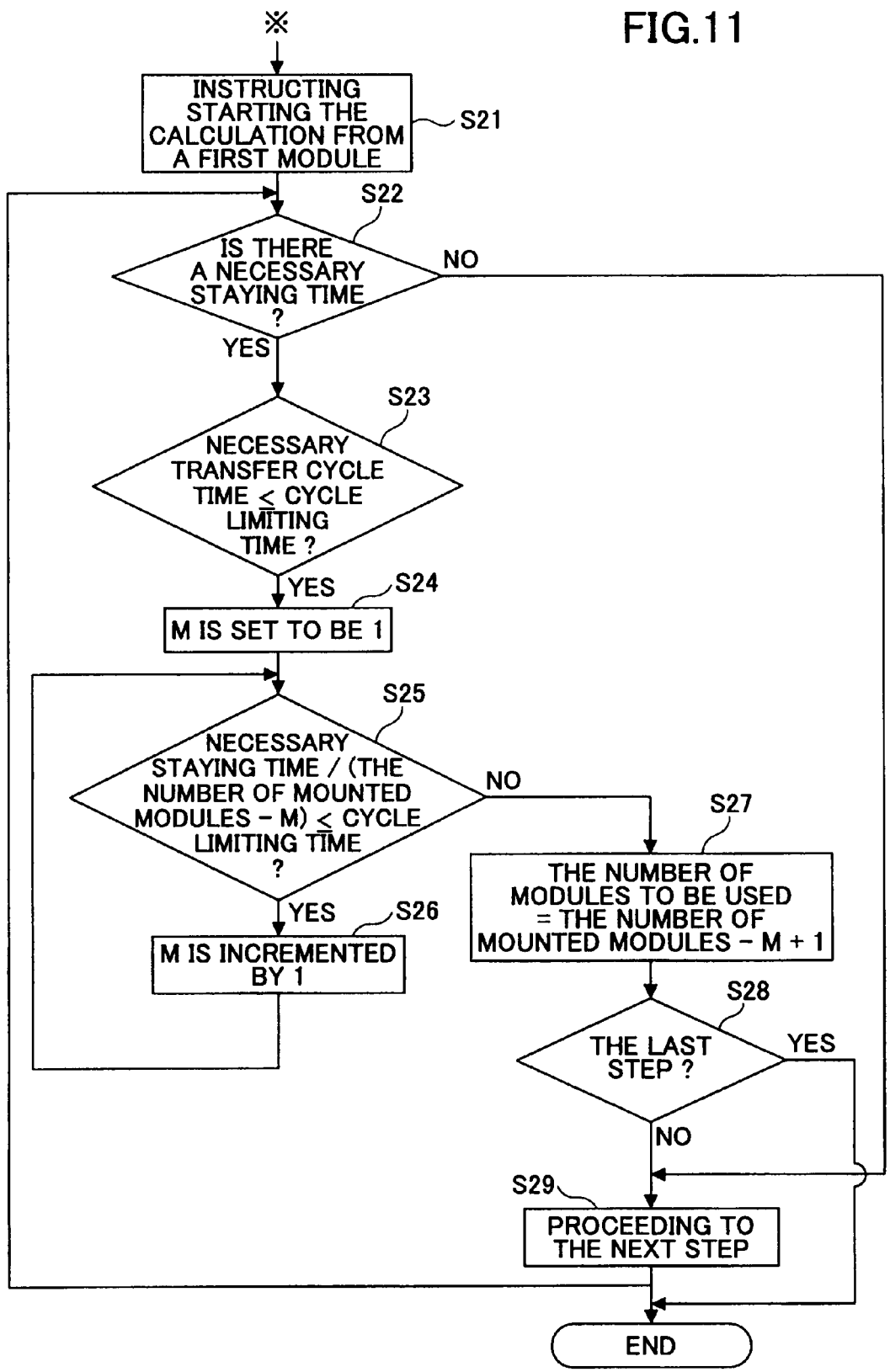
FIG. 11 is a flowchart for explaining an effect of the coater/developer according to the embodiment of the present invention.

After the number of the modules to be used is determined at Step S18, the procedure proceeds to Step S19, where it is determined whether the module whose number is obtained is the last module in the transfer flow. When the module is the last one listed in the transfer flow (Step S19: Y), other procedures shown in FIG. 11 are carried out (described later). Alternatively, when the module is not the last one (Step S19: N), the procedure returns to Step S12 via Step S20 and Step S12 and beyond are carried out. With this, the number of the modules to be used is obtained for the next module listed in the transfer flow.

Figure 10:
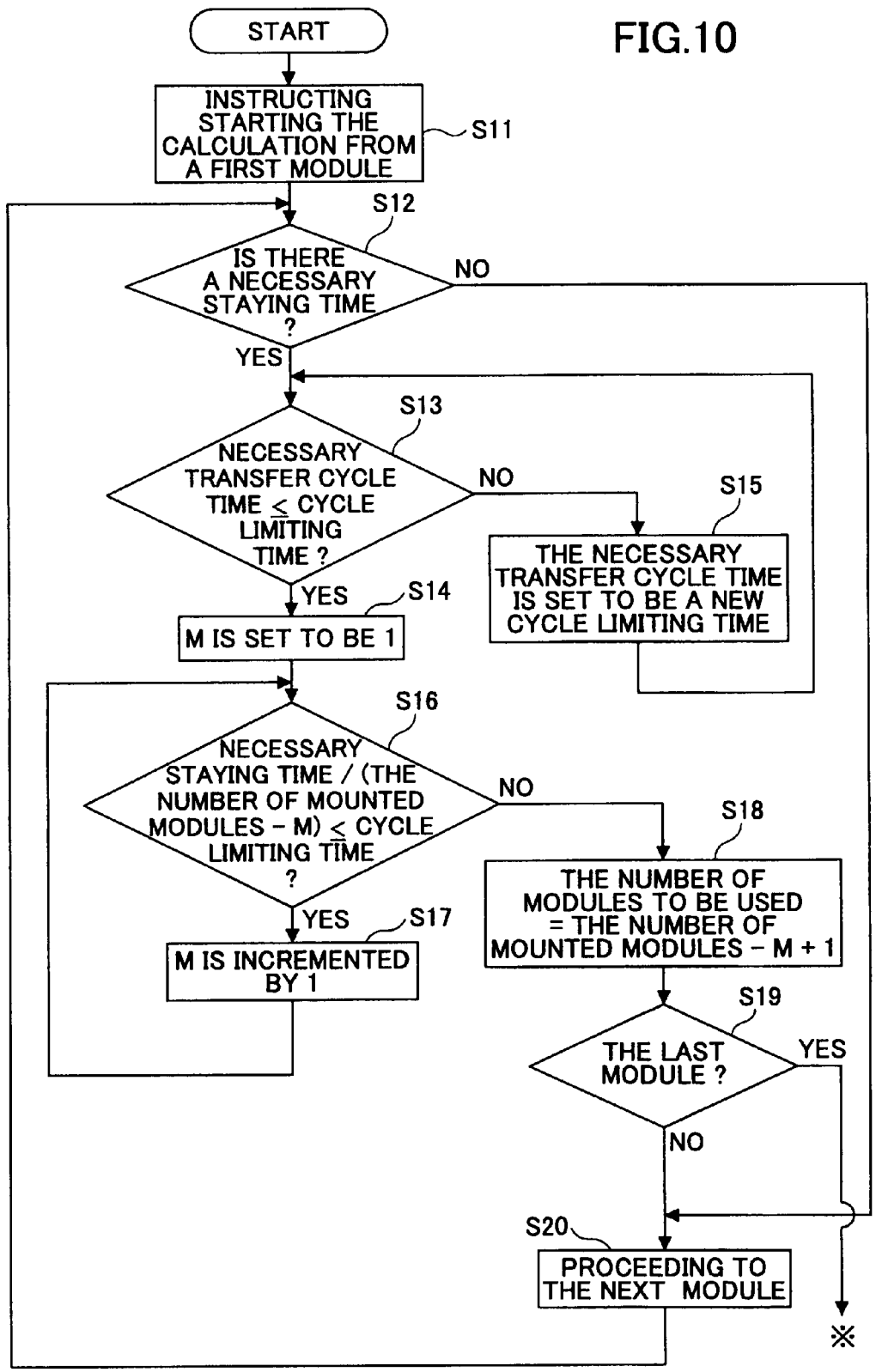
FIG. 10 is a flowchart for explaining an effect of the coater/developer according to the embodiment of the present invention.

As stated, the number of the modules to be used is obtained for all the modules listed in the transfer flow, namely from the transfer module TRS through the temperature control module CPL (step 20) in accordance with the flowchart in FIG. 10. Here, the procedure in accordance with the same flowchart is explained again taking as an example the heating module LHP listed at step 6 in the transfer flow in FIG. 9. As listed in the transfer flow, because the necessary staying time is 90 seconds and there are four heating modules LHP mounted in the resist pattern forming apparatus, the necessary transfer cycle time is 22.5 seconds, which exceeds the cycle limiting time of 20 seconds at this time. Then, the cycle limiting time is newly set to be 22.5 seconds at Step S15, and the procedure proceeds to Step S13. Then, Step S13 and beyond are carried out under the new cycle limiting time of 22.5 seconds.

At Step S16 in the flowchart of FIG. 10, it is determined that the necessary transfer cycle time exceeds the new cycle limiting time (22.5 seconds) because the value obtained by dividing the necessary staying time (90 seconds) by (the number of the mounted heating modules LHP (4)−1 (m=1)) is 30 seconds. Then, the procedure proceeds to Step S18, where the number of the heating modules LHP to be used is calculated to 4 (4−1+1) following the expression (1).

Next, the heating module LHP listed at step 10 of the transfer flow in FIG. 9 is taken as an example. Because the necessary staying time is 90 seconds and the number of the mounted heating modules LHP is 9, the necessary transfer cycle time is 10 seconds, which is within the new cycle limiting time of 22.5 seconds (Step S13: Y). Therefore, the procedure proceeds to Step S16, where it is determined whether the value obtained by dividing the necessary staying time (90 seconds) by (the number of the mounted heating modules LHP (9)−m (1)) is within the new cycle limiting time. Because the value (11.5 seconds) is within the new cycle limiting time (22.5 seconds), the procedure returns to Step S16 after m is incremented to 2 at Step S17. After Steps S16 and S17 are repeated until m becomes 6, the value obtained by dividing the necessary staying time (90 seconds) by (the number of the mounted heating modules LHP (9)−m (6)) is 30 seconds, which exceeds the new cycle limiting time of 22.5 seconds (Step S16: N). Therefore, the procedure proceeds to Step S18, where the number of the heating modules LHP to be used is determined to be 4 (9−6+1) in accordance with the expression (1).

In such a manner, the calculation portion 74 for calculating the number of modules to be used calculates the necessary transfer cycle time for all the modules listed in the transfer flow in accordance with the listing order, and determines the number of the modules to be used to be a value obtained by dividing the necessary staying time in the modules by the cycle limiting time, or a nearest integer to which this value is raised (instead of the value) when the necessary transfer cycle time is less than or equal to the cycle limiting time. Alternatively, the calculation portion 74 determines a new cycle limiting time to be the calculated necessary transfer cycle time when the necessary transfer cycle time is larger than the cycle limiting time, and determines the number of the modules to be used to be a value obtained by dividing the necessary staying time in the modules by the new cycle limiting time, or a nearest integer to which this value is raised (instead of the value). The numbers of the modules to be used, which are obtained in this manner, are listed in the transfer flow as shown in FIG. 12.

Continuing from Step S6 (FIG. 8), the number of the modules to be used is recalculated for all the modules listed in the transfer flow in accordance with the listing order at Step S7. This recalculation is carried out in accordance with the flowchart shown in FIG. 11. This flowchart is different from the previous flowchart shown in FIG. 10 in that the flowchart in FIG. 11 lacks Step S15 that exists in the previous flowchart. This is because the necessary transfer cycle time has already been calculated for all the modules and thus the longest one of the necessary transfer cycle times has been determined to be the cycle limiting time. Namely, there is no need to set a new cycle limiting time. However, the remaining parts of the flowchart in FIG. 11 are the same as the previous one in FIG. 10, and therefore repetitive explanations about the remaining parts are omitted.

Next, at Step S8 (FIG. 8), the operator selects modules to be used by using a module-specific identification number through the module selection portion 75 for selecting modules to be used. For example, the operator can specify LHP1, LHP2, LHP3, and LHP4 when he or she selects four heating modules (LHP) in the COT layer B3. Then, the transfer schedule producing portion 76 produces a transfer schedule where the transfer order and the wafer number of the wafer W are associated with each other. In the coater/developer, the wafer W is transferred in accordance with the transfer order and a predetermined resist pattern forming process is carried out for the wafer W. In this transfer schedule, one cycle of the transfer schedule is carried out in the new cycle limiting time of 22.5 seconds.

In such a configuration, when the operator selects the modules to be used in accordance with the transfer order and selects the process recipe corresponding to the process carried out in each of the modules, the number of the modules to be used is automatically calculated for each of the modules. Therefore, the exact number of the modules to be used is obtained without relying on the operator's experience or guess. In this case, because the number of the modules to be used is determined in accordance with the cycle limiting time of the modules, the number means the necessary minimum number that enables one cycle of the transfer schedule to be carried out within the cycle limiting time.

Therefore, according to the coater/developer of this embodiment, since the transfer schedule does not include modules that are not used, in contrast to the related art coater/developer, unnecessary temperature control for, for example, the heating modules LHP, the hydrophobizing process modules ADH, and the like that are not used can be avoided, thereby saving electricity and reducing running cost.

In addition, because the number of the modules to be used is recalculated after the number of the modules to be used has been calculated for all the modules listed in the transfer flow, even when the necessary transfer cycle time for, for example, the last module in the transfer flow is set to be a new cycle limiting time, the number of the modules to be used can be recalculated under the new cycle limiting time, thereby accurately determining the number of the modules to be used.

Figure 13:
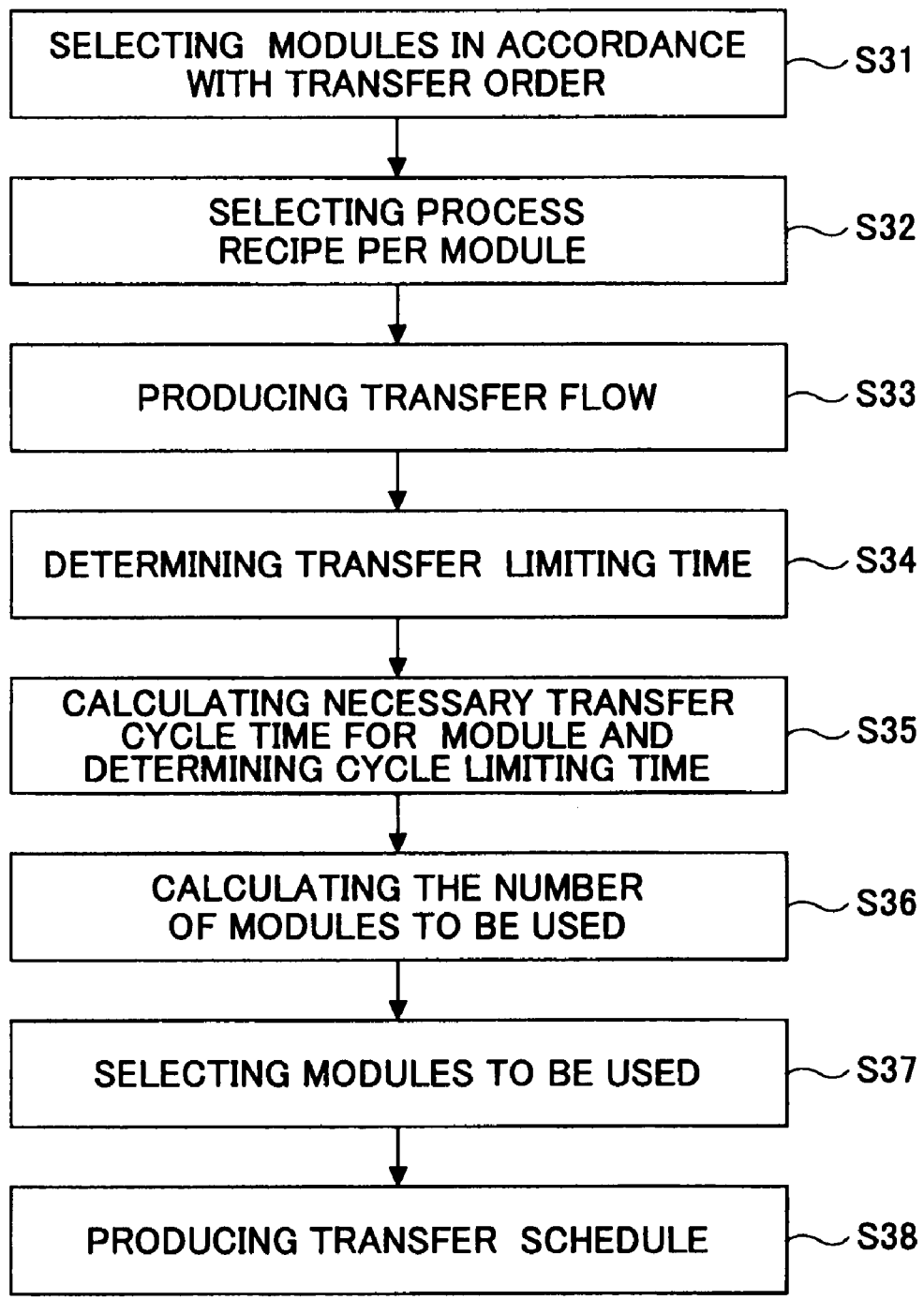
FIG. 13 is a flowchart for explaining a way of determining the number of modules to be used in the coater/developer according to the embodiment of the present invention.

While the number of the modules to be used can be determined as stated above, the number of the modules to be used may be determined in a different manner in accordance with a flowchart shown in FIG. 13. In this example, Steps S31 through S34 in FIG. 13 are the same as Step S1 through S4 in FIG. 8, respectively. However, the cycle limiting time determining portion 73 calculates the necessary transfer cycle time for all the modules listed in the transfer flow, compares the longest one of the necessary transfer cycle times with the transfer limiting time, and determines the cycle limiting time to be the longer one of the longest necessary transfer cycle time and the transfer limiting time at Step S35. Even in this case, Step S34 for determining the transfer limiting time and a step for comparing the longest necessary transfer cycle time with the transfer limiting time may be omitted, so that the longest necessary transfer cycle time may be determined to be the cycle limiting time.

Figure 14:
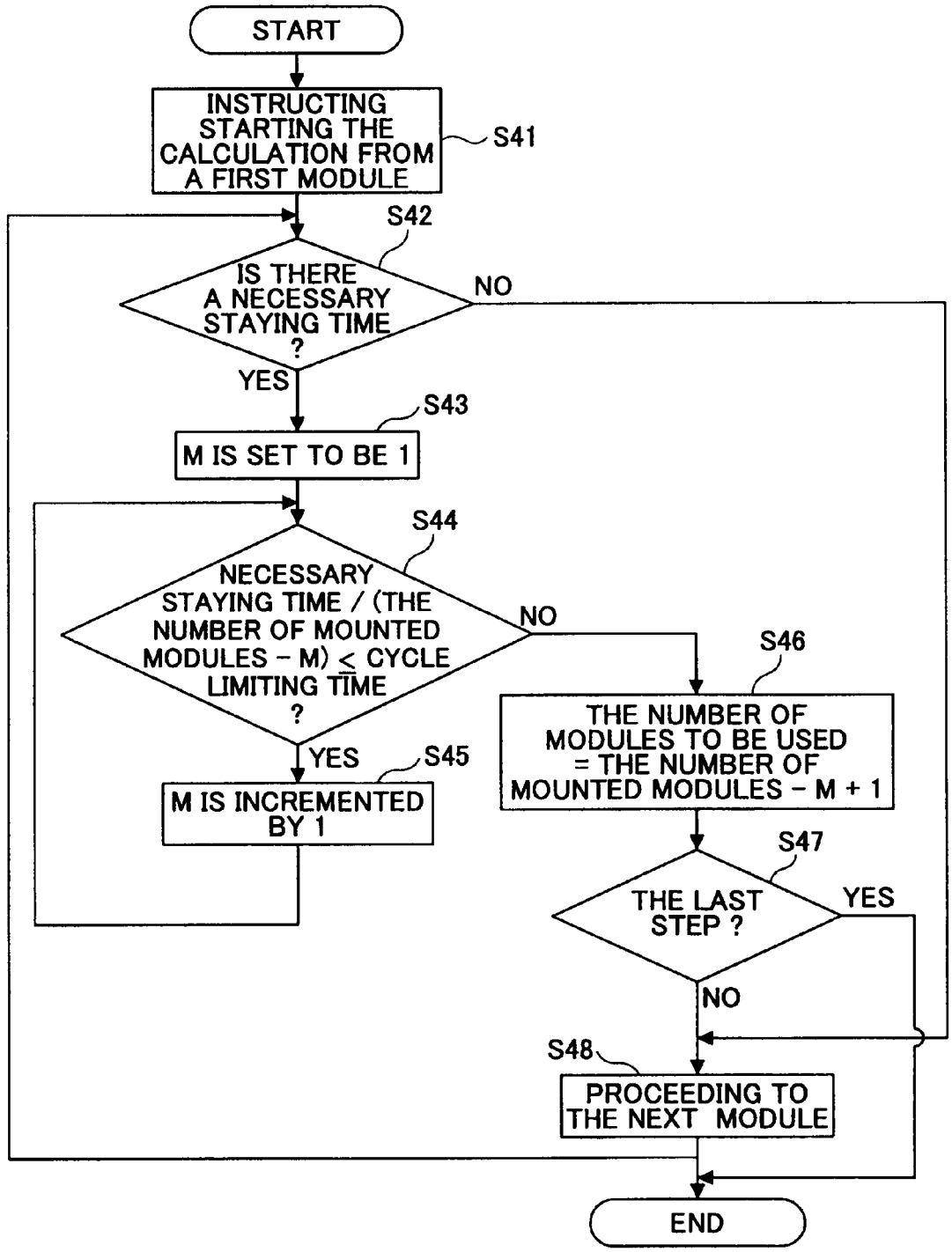
FIG. 14 is a flowchart for explaining another way of calculating the number of modules to be used in the coater/developer according to the embodiment of the present invention.

The calculation portion 74 for calculating the number of modules to be used determines the number of, for example, the heating modules to be used to be a value obtained by dividing the necessary staying time for the heating modules by the cycle limiting time, or a nearest integer to which this value is raised (Step S6). This step is specifically explained with reference to a flowchart in FIG. 14. First, an instruction is output to start calculation from a first module in the transfer flow at Step S41, and then it is determined whether there is the necessary staying time for the first module at Step S42. When there is not the necessary staying time (Step S42: N), this procedure proceeds to Step S48, where a next instruction is output to proceed to the next module in the transfer flow.

On the other hand, when there is the necessary staying time for the first module (Step S42: Y), the procedure proceeds to Step S44 via Step S43, where it is determined whether a value obtained by dividing the necessary staying time by (the number of the mounted modules−1) is within the cycle limiting time. When the value is within the cycle limiting time (Step S44: Y), the procedure proceeds to Step S45, where m is incremented by 1, and returns to the Step S44. On the other hand, when the value exceeds the cycle limiting time (Step S44: N), the procedure proceeds to Step S46, where the number of the modules to be used is calculated in accordance with the expression (1).

After the number of the modules to be used is determined at Step S46, the procedure proceeds to Step S47, where the module is the last listed in the transfer flow. When the module is not the last one in the transfer flow (Step S47: N), the procedure proceeds to Step S48, and then the calculation is carried out for the next module. Alternatively, when the module is the last one in the transfer flow (Step S47: Y), the procedure is completed.

In this example, before the number of the modules to be used is calculated, the longest necessary transfer time of the necessary transfer times obtained for all the modules listed in the transfer flow is determined to be the cycle limiting time. Therefore, the cycle limiting time is not newly set when the number of the modules to be used is calculated, which facilitates the calculation. In addition, because the cycle limiting time is not newly set when the number of the modules to be used is calculated, the recalculation explained with reference to FIG. 11 is not required.

The above calculation of the number of the modules to be used may be carried out only for the heating modules LHP, PHP, LHA, and the like. Even if such calculation is not carried out for the temperature control modules and, as a result, there are the temperature control modules where the temperature is maintained at a predetermined temperature while not being used, those temperature control modules consume only a small amount of electricity.

In addition, it is not necessary to recalculate the number of the modules to be used (FIG. 11). This is because the number of the modules to be used can be accurately obtained for some of the heating modules by the calculation of the number of the modules to be used (FIG. 10), which can save electricity.

Moreover, while the heating modules are selected by the operator in the above embodiment, the heating modules can be selected, for example, based on a process temperature of a heating module that is used for a previous lot, a temperature of a heating module that is not used for the previous lot, and a process temperature at which a lot is to be processed in the immediate run in other embodiments of the present invention. With this, the heating modules can be selected so that a temperature setting time is reduced.

Specifically, when the process temperature of the heating module used for the previous lot is the same as the process temperature at which the immediate lot is to be processed, the heating module used for the previous lot is selected in the immediate run. In this case, setting a different temperature is not necessary. Alternatively, when the process temperature of the heating module used for the previous lot is not the same as the temperature at which the immediate lot is to be processed and there are heating modules not used for the previous lot, the unused heating modules can be selected in the immediate run. In the following, it is assumed that the previous lot has 20 wafers referred to as wafers W1 through W20. When the same heating module is used for the immediate lot, temperature control for the immediate lot starts right after the wafer W20 is processed. Therefore, the module has to be in an idle state until the temperature is stabilized at the process temperature for the immediate lot. On the other hand, when a different heating module not used for the previous lot is used for the immediate lot, the temperature control can start before the last wafer W20 is finished. Therefore, there is no waiting time between the previous and the immediate lots when the heating module not used for the previous lot is selected in the immediate run.

The above manner of selecting the heating modules is more specifically explained taking an example of six heating modules LHP1 through LHP6 mounted in the coater/developer. It is assumed in the following that the heating modules LHP1, LHP2, LHP3, and LHP4 are used for the previous lot, four out of the six heating modules LHP1 through LHP6 are used for the immediate lot, and the process temperatures are different between the previous and the immediate lots.

In this case, the heating modules LHP5 and LHP6, which are not used for the previous lot, are selected for the immediate lot and can be temperature-controlled while the previous lot is being processed so that these heating modules LHP5 and LHP6 are ready for the immediate run before the previous run is finished. Therefore, a first wafer B1 of the immediate lot can be transferred into the heating module LHP5 and a second wafer B2 of the immediate lot can be transferred into the heating module LHP6 right after the previous run is finished.

On the other hand, because wafers in the previous lot are transferred into the heating modules LHP1, LHP2, LHP3, and LHP4 in this order, when a second to last wafer is in the heating module LHP3, the heating modules LHP1 and LHP2 can be empty, which means the temperature control to a process temperature for the immediate lot can start before the previous run is finished. In addition, because the first wafer B1 of the immediate lot is transferred into the heating module LHP5 and the second wafer B2 of the immediate lot is transferred into the heating module LHP6, there is enough time from when the heating modules LHP1 and LHP2 become empty to when wafers B3 and B4 of the immediate lot are introduced into the heating modules LHP1 and LHP2, respectively. Therefore, when the heating modules LHP1 and LHP2 are selected for the immediate lot, the temperature setting time is substantively reduced. However, in order to carry out this way of selecting the heating modules, the operator has to specify the transfer order of the wafers, calculate the number of the heating modules to be used, and select the heating modules to be used.

While the coater/developer according to the embodiment of the present invention is used to process a semiconductor wafer, the coater/developer according to other embodiments of the present invention may be used to process a glass substrate for a Liquid Crystal Panel (LCD substrate). In addition, the coater/developer according to the embodiment of the present invention may have a different configuration. For example, the coating modules and the developing modules may be arranged in the same block. Additionally, the type, the number, and the arrangement of modules mounted in the coater/developer may be optionally determined, and the transfer order may also be optionally determined.

What is claimed is:

1. A coating/developing method carried out in a coater/developer apparatus having
   a carrier block where a carrier housing plural substrates is placed and that has a transfer unit for transferring one of the substrates into and out from the carrier, and
   a process block where a coating film is formed on the substrate transferred from the carrier by the transfer unit and a developing process is carried out with respect to the substrate after an exposure process,
   wherein the process block includes
   plural liquid process modules where a coating solution is coated on the substrate,
   plural heating modules where the substrate is heated,
   plural temperature control modules where a temperature of the substrate is controlled, and
   a substrate transferring unit configured to transfer a first substrate out from a first module of the plural liquid process modules, the plural heating modules, and the plural temperature control modules, the first substrate having been processed in the first module, and transfer a second substrate into the first module, the second substrate having been processed in a second module located upstream from the first module by one process step in a wafer transfer route,
   the coating/developing method comprising steps of:
   producing, in accordance with a process recipe concerning the carrier in the carrier block, a transfer flow where a type of the modules listed in accordance with a substrate transfer order in the transfer flow is associated with a necessary staying time from when the substrate is transferred into any one of the modules by the substrate transferring unit to when the substrate undergoes a corresponding process in the module and is ready to be transferred back to the substrate transferring unit, the necessary staying time being determined corresponding to the type of the modules;
   calculating a necessary transfer cycle time by dividing the necessary staying time by the number of the corresponding modules mounted in the coater/developer apparatus, the necessary transfer cycle time being obtained with respect to the modules listed in the transfer flow, thereby determining the longest necessary transfer cycle time to be a cycle limiting time; and
   calculating a value by dividing the necessary staying time by the cycle limiting time, thereby determining the number of the modules to be used to be one of the value and a nearest integer to which the value is raised, the number of the modules to be used being determined with respect to the heating modules listed in the transfer flow.

2. A coating/developing method carried out in a coater/developer apparatus having
   a carrier block where a carrier housing plural substrates is placed and that has a transferring unit for transferring one of the substrates into and out from the carrier, and
   a process block where a coating film is formed on the substrate transferred from the carrier by the transferring unit and a developing process is carried out with respect to the substrate after an exposure process,
   wherein the process block includes
   plural liquid process modules where a coating solution is coated on the substrate,
   plural heating modules where the substrate is heated,
   plural temperature control modules where a temperature of the substrate is controlled, and
   a substrate transferring unit configured to transfer a first substrate out from a first module of the plural liquid process modules, the plural heating modules, and the plural temperature control modules, the first substrate having been processed in the first module, and transfer a second substrate into the first module, the second substrate having been processed in a second module located upstream from the first module by one process step in a wafer transfer route,
   the coating/developing method comprising steps of:
   producing, in accordance with a process recipe concerning the carrier in the carrier block, a transfer flow where a type of the modules listed in accordance with a substrate transfer order in the transfer flow is associated with a necessary staying time from when the substrate is transferred into any one of the modules by the substrate transferring unit to when the substrate undergoes a corresponding process in the module and is ready to be transferred back to the substrate transferring unit, the necessary staying time being determined corresponding to the type of the modules;
   determining the cycle limiting time to be a necessary transfer cycle time obtained by dividing the necessary staying time in a coating module that coats a resist solution on the substrate and is included in the plural liquid process modules by the number of the coating modules mounted in the coater/developer apparatus; and
   calculating the necessary transfer cycle time with respect to the modules listed in the transfer flow in accordance with the listing order, determining the number of the heating modules to be used to be one of a value obtained by dividing the necessary staying time in the heating modules by the cycle limiting time and a nearest integer to which the value is raised when the necessary transfer cycle time is less than or equal to the cycle limiting time, and determining the necessary transfer cycle time to be a new cycle limiting time when the necessary transfer cycle time is greater than the cycle limiting time and then determining the number of the heating modules to be used to be one of a value obtained by dividing the necessary staying time in the heating modules by the new cycle limiting time and a nearest integer to which the value is raised.

3. The coating/developing method of claim 2, further comprising a step of recalculating the number of the modules to be used with respect to the modules listed in the transfer flow in the listing order after the step of calculating the number of the modules to be used with respect to the modules listed in the transfer flow in the listing order.

* * * * *